US008587555B2

(12) United States Patent
Chang et al.

(10) Patent No.: US 8,587,555 B2
(45) Date of Patent: *Nov. 19, 2013

(54) METHOD AND DEVICE FOR CAPACITIVE POSITION DETECTION

(75) Inventors: Chin-Fu Chang, Taipei (TW); Cheng-Han Lee, Taipei (TW); Chi-Hao Tang, Taipei (TW); Shun-Lung Ho, Taipei (TW)

(73) Assignee: EGALAX_EMPIA Technology Inc., Taipei (TW)

( * ) Notice: Subject to any disclaimer, the term of this patent is extended or adjusted under 35 U.S.C. 154(b) by 292 days.

This patent is subject to a terminal disclaimer.

(21) Appl. No.: 12/923,803

(22) Filed: Oct. 8, 2010

(65) Prior Publication Data

US 2011/0084936 A1    Apr. 14, 2011

Related U.S. Application Data

(60) Provisional application No. 61/298,252, filed on Jan. 26, 2010, provisional application No. 61/298,243, filed on Jan. 26, 2010, provisional application No. 61/250,051, filed on Oct. 9, 2009.

(51) Int. Cl.
    *G06F 3/045*    (2006.01)
(52) U.S. Cl.
    USPC ......................................... 345/174; 345/173
(58) Field of Classification Search
    USPC ................... 345/156–174; 178/18.01–18.06;
    324/658; 463/16, 20, 25
    See application file for complete search history.

(56) References Cited

U.S. PATENT DOCUMENTS

| 4,639,720 | A | * | 1/1987 | Rympalski et al. | ........... 345/174 |
| 5,374,787 | A | * | 12/1994 | Miller et al. | ............... 178/18.06 |
| 5,412,200 | A | * | 5/1995 | Rhoads | ....................... 250/201.9 |
| 5,543,588 | A | * | 8/1996 | Bisset et al. | ............... 178/18.06 |
| 5,644,512 | A | * | 7/1997 | Chernoff et al. | ................. 702/85 |
| 5,825,670 | A | * | 10/1998 | Chernoff et al. | ................. 702/85 |
| 5,861,583 | A | * | 1/1999 | Schediwy et al. | ......... 178/18.06 |
| 6,075,520 | A | * | 6/2000 | Inoue et al. | .................... 345/173 |
| 6,150,809 | A | * | 11/2000 | Tiernan et al. | ................. 324/238 |
| 6,723,929 | B2 | * | 4/2004 | Kent | .......................... 178/18.04 |
| 6,781,577 | B2 | * | 8/2004 | Shigetaka | ...................... 345/173 |
| 7,072,778 | B2 | * | 7/2006 | Swanson | ......................... 702/57 |
| 7,167,773 | B2 | * | 1/2007 | Schneider et al. | ............ 700/198 |
| 7,315,793 | B2 | * | 1/2008 | Jean | .............................. 702/150 |
| 7,339,580 | B2 | * | 3/2008 | Westerman et al. | .......... 345/173 |
| 7,663,607 | B2 | * | 2/2010 | Hotelling et al. | ............. 345/173 |
| 7,728,816 | B2 | * | 6/2010 | Xu et al. | ........................ 345/163 |
| 8,089,470 | B1 | * | 1/2012 | Schediwy et al. | ............. 345/173 |
| 8,102,376 | B2 | * | 1/2012 | Lii et al. | ........................ 345/173 |

(Continued)

FOREIGN PATENT DOCUMENTS

| CN | 1164286 | 11/1997 |
| CN | 1596412 | 3/2005 |

(Continued)

*Primary Examiner* — Ricardo L Osorio

(74) *Attorney, Agent, or Firm* — WPAT, PC; Justin King

(57) ABSTRACT

The method and device for capacitive position detection are disclosed. The touch related sensors within a sensing device with a plurality of sensors are detected first. Therefore at least a range of the mutual capacitance detection for detecting sensing information can be determined according to the touch related sensors. The sensing information within the range of the mutual capacitance detection can be used for generating a two-dimension sensing information.

21 Claims, 15 Drawing Sheets

(56) References Cited

U.S. PATENT DOCUMENTS

| | | | |
|---|---|---|---|
| 8,169,421 B2* | 5/2012 | Wright et al. | 345/179 |
| 8,212,782 B2* | 7/2012 | Cho et al. | 345/173 |
| 2005/0173820 A1* | 8/2005 | Schneider et al. | 264/40.1 |
| 2006/0028457 A1* | 2/2006 | Burns | 345/179 |
| 2006/0071674 A1* | 4/2006 | Jean | 324/686 |
| 2006/0244735 A1* | 11/2006 | Wilson | 345/173 |
| 2007/0229466 A1* | 10/2007 | Peng et al. | 345/173 |
| 2007/0273574 A1* | 11/2007 | Barnum | 342/90 |
| 2008/0048990 A1* | 2/2008 | Cho et al. | 345/173 |
| 2008/0143681 A1* | 6/2008 | XiaoPing | 345/173 |
| 2008/0147350 A1* | 6/2008 | Jean | 702/150 |
| 2008/0158185 A1* | 7/2008 | Westerman | 345/173 |
| 2008/0180404 A1* | 7/2008 | Han et al. | 345/173 |
| 2008/0196945 A1* | 8/2008 | Konstas | 178/18.03 |
| 2008/0309634 A1* | 12/2008 | Hotelling et al. | 345/173 |
| 2009/0066669 A1* | 3/2009 | Olson | 345/174 |
| 2009/0085894 A1* | 4/2009 | Gandhi et al. | 345/175 |
| 2009/0174675 A1* | 7/2009 | Gillespie et al. | 345/173 |
| 2009/0211817 A1* | 8/2009 | Chang et al. | 178/18.01 |
| 2009/0273571 A1* | 11/2009 | Bowens | 345/173 |
| 2010/0007629 A1 | 1/2010 | Chang et al. | |
| 2010/0007630 A1 | 1/2010 | Chang et al. | |
| 2010/0007631 A1 | 1/2010 | Chang et al. | |
| 2010/0026656 A1* | 2/2010 | Hotelling et al. | 345/174 |
| 2010/0079405 A1* | 4/2010 | Bernstein | 345/174 |
| 2010/0156852 A1* | 6/2010 | Chu et al. | 345/176 |
| 2010/0283785 A1* | 11/2010 | Satulovsky | 345/440 |
| 2010/0295821 A1* | 11/2010 | Chang et al. | 345/175 |
| 2012/0043141 A1* | 2/2012 | Xiaoping | 178/18.06 |
| 2012/0044150 A1* | 2/2012 | Karpin et al. | 345/173 |

FOREIGN PATENT DOCUMENTS

| | | |
|---|---|---|
| CN | 1720498 | 1/2006 |
| CN | 1811680 | 8/2006 |
| CN | 1845045 | 10/2006 |
| CN | 1885251 | 12/2006 |
| CN | 100419657 | 12/2006 |
| CN | 1942853 | 4/2007 |
| CN | 101059741 | 10/2007 |
| CN | 201156246 | 11/2008 |
| CN | 201181467 | 1/2009 |
| CN | 101369200 | 2/2009 |
| CN | 101452360 | 6/2009 |
| CN | 101526871 | 9/2009 |
| CN | 101539832 | 9/2009 |
| CN | 102023768 | 4/2011 |
| EP | 1191430 | 3/2001 |
| EP | 1630652 | 3/2006 |
| GB | 2009007704 | 1/2009 |
| TW | 201015413 | 4/2010 |
| WO | 2008083362 | 7/2008 |

* cited by examiner

METHOD AND DEVICE FOR CAPACITIVE POSITION DETECTION

CROSS REFERENCE TO RELATED APPLICATIONS

This application claims the benefit of U.S. Provisional Application No. 61/298,252, filed on Jan. 26, 2010, Provisional Application No. 61/298,243, filed on Jan. 26, 2010 and U.S. Provisional Application No. 61/250,051, filed on Oct. 9, 2009, which is herein incorporated by reference for all intents and purposes.

CROSS-REFERENCE TO COMPUTER PROGRAM LISTING APPENDDC

Appendix A contains the following file in one CD-ROM in IBM-PC format and compatible with Microsoft Windows (of which two identical copies are attached hereto). Appendix A is a part of the present disclosure and is incorporated by reference herein in its entirety.
Directory of E:\
Oct. 8, 2010, 127,488 appendix.doc
1 File(s) 127,488 bytes
0 Dir(s) 0 bytes free
The files of Appendix A form source code of computer programs for implementing an illustrative embodiment of the present invention.

COPYRIGHT NOTICE

A portion of the disclosure of this patent document contains material which is subject to copyright protection. The copyright owner has no objection to the facsimile reproduction by anyone of the patent document or the patent disclosure, as it appears in the patent and trademark office patent files or records, but otherwise reserves all copyright rights whatsoever.

BACKGROUND OF THE INVENTION

1. Field of the Invention

The present invention relates to a method and device for position detection, and more particularly, to a method and device for capacitive position detection.

2. Description of the Prior Art

Touch displays have been widely used in the various electronic devices. One approach is to employ a touch sensitive panel to define a two-dimension (2-D) touch area on the touch display, where sensing information is obtained by scanning along horizontal and vertical axes of the touch panel for determining the touch or proximity of an external object (e.g. a finger) on or near the touch panel. U.S. Pat. No. 4,639,720 discloses a capacitive touch display.

Sensing information can be converted into a plurality of continuous signal values by an analog-to-digital converter (ADC). By comparing signal values before and after the touch or approaching of the external object, the location touched or approached by the external object can be determined.

Generally, a controller controlling the touch panel will first obtain sensing information when there is no external object touching or approaching as a baseline. For example, in a capacitive touch panel, each conductive line corresponds to a respective baseline. The controller determines whether there is an external object touching or approaching by comparing sensing information obtained subsequently with the baseline, and further determines the position of the external object. For example, when there is no external object touching or approaching the touch panel, subsequent sensing information with respect to the baseline will be or close to zero. Thus, the controller can determine whether there is an external object touching or approaching by determining whether the sensing information with respect to the baseline is or close to zero.

As shown in FIG. 1A, when an external object 12 (e.g. a finger) touches or approaches a sensing device 120 of a touch display 10, sensing information of sensors 140 on an axis (e.g. x axis) is converted into signal values as shown in FIG. 1B. Corresponding to the appearance of the finger, the signal values show a waveform or finger profile. The location of the peak 14 of the finger profile indicates the position touched or approached by the finger.

Normally, a 2-D sensing information consists of a plurality of 1-D sensing information, that is, it is generated after several detections on a plurality of sensors, requiring a considerable amount of time. When sampling frequency for touch location is required to be higher, how to reduce the time for generating 2-D sensing information becomes critical. However, 2-D sensing information is mostly irrelevant to touches, and continuous performing detections that are irrelevant to touches can be time and energy consuming. How to save energy and time has become very important.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

The present invention provides a method and device for capacitive position detection. The present invention generates 2-D sensing information by self capacitance detection in conjunction with mutual capacitance detection or determines touch related sensing information from 2-D sensing information.

Normally, a 2-D sensing information consists of a plurality of 1-D sensing information, that is, it is generated after several detections on a plurality of sensors, requiring a considerable amount of time. When sampling frequency for touch location is required to be higher, how to reduce the time for generating 2-D sensing information becomes critical.

However, most of the ranges in 2-D sensing information are irrelevant to touches, so if only signals of touch related sensors are detected, one can save a significant amount of time.

Moreover, when detecting touch related information in 2-D sensing information, the larger the 2-D sensing information, the greater the range that needs to be detected, and accordingly, the greater the amount of computations. However, most of the ranges in 2-D sensing information are irrelevant to touches, so if only touch related sensing information are detected at those areas where touches may have occurred, one can save a significant amount of time.

The present invention includes at least the following objectives:
1. a range of mutual capacitance detection is decided based on the result of self capacitance detection;
2. a range of mutual capacitance detection is decided based on the result of a capacitance detection under reduced water stains or conductive impurities;

3. 2-D sensing information encompassing the entire sensing device is generated based only on touch related sensing information; and 4. a range for detecting touch related sensing information on 2-D sensing information is decided based on the result of self capacitance detection or 1-D sensing information deduced from 2-D sensing information.

The objectives of the present invention can be achieved by the following technical schemes. A method for capacitive position detection proposed by the present invention includes: providing a capacitive sensing device including a plurality of sensors that include a plurality of first sensors and a plurality of second sensors, wherein these first and second sensors overlap at a plurality of overlapping points; detecting each touch related sensor; determining at least one range of mutual capacitance detection based on all the touch related sensors; performing a mutual capacitance detection on the at least one range of mutual capacitance detection to determine a sensing information of the at least one range of mutual capacitance detection; and generating a 2-D sensing information based on the sensing information of the at least one range of mutual capacitance detection. Moreover, a device for capacitive position detection proposed by the present invention includes: a capacitive sensing device including a plurality of sensors that include a plurality of first sensors and a plurality of second sensors, wherein these first and second sensors overlap at a plurality of overlapping points; and a controller for performing operations including: detecting each touch related sensor; determining at least one range of mutual capacitance detection based on all the touch related sensors; performing a mutual capacitance detection on the at least one range of mutual capacitance detection to determine a sensing information of the at least one range of mutual capacitance detection; and generating a 2-D sensing information based on the sensing information of the at least one range of mutual capacitance detection.

The objectives of the present invention can also be achieved by the following technical schemes. A method for capacitive position detection proposed by the present invention includes: obtaining a 2-D sensing information; obtaining at least one 1-D sensing information; determining at least one detected range in the 2-D sensing information based on the at least one 1-D sensing information when a capacitive sensing device is being touched or approached; and determining each touch related sensing information in the at least one detected range. Moreover, a device for capacitive position detection proposed by the present invention includes: a capacitive sensing device including a plurality of sensors that include a plurality of first sensors and a plurality of second sensors, wherein these first and second sensors overlap at a plurality of overlapping points; and a controller for performing operations including: obtaining a 2-D sensing information; obtaining at least one 1-D sensing information; determining at least one detected range in the 2-D sensing information based on the at least one 1-D sensing information when a capacitive sensing device is being touched or approached; and determining each touch related sensing information in the at least one detected range.

By aforementioned technical schemes, the present invention achieves at least the following advantages and benefits:

1. By deciding the range of mutual capacitance detection based on the result of self capacitance detection, the range for mutual capacitance detection can be reduced significantly, thereby saving a considerable amount of detection time;

2. By deciding the range of mutual capacitance detection based on the result of a capacitance detection under reduced water stains or conductive impurities, the circumstances of performing mutual capacitance detection in the range interfered by water stains or conductive impurities can be reduced;

3. By generating the 2-D sensing information encompassing the entire sensing device based only on touch related sensing information, less time is required for generating the 2-D sensing information;

4. By deciding the range for detecting touch related sensing information on 2-D sensing information based on the result of self capacitance detection or 1-D sensing information deduced from 2-D sensing information, time required for detecting touch related sensing information can be reduced.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
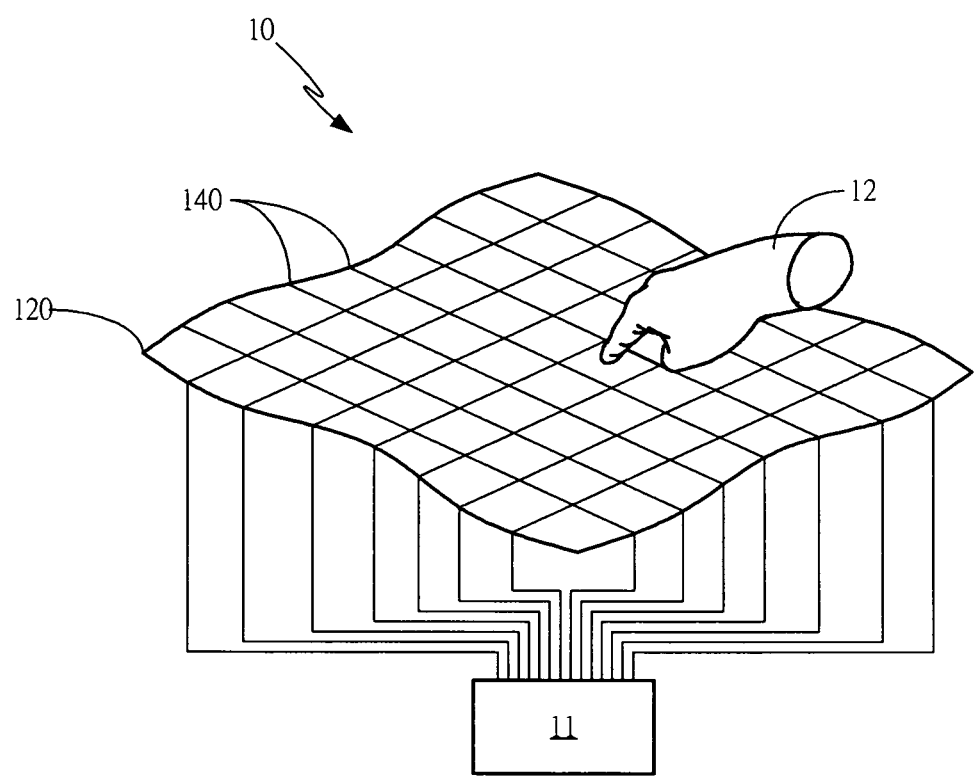
FIG. 1A is a schematic diagram depicting a prior-art touch sensitive device.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Sensing Information

In the present invention, sensing information can be provided by a touch sensitive device for representing 1-D, 2-D or multi-dimensional statuses on the touch sensitive device. The sensing information can be obtained by one or more sensors and converted into a plurality of continuous signal values by one or more Analog-to-Digital converters to represent among or change in amount of detected charges, current, voltage, capacitance, impedance or other electrical characteristics. Sensing information can be obtained or transmitted alternately, sequentially or in parallel, and can be compounded into one or more signals. These are obvious to those having ordinary skill in the art.

One having ordinary skill in the art may also recognize that sensing information described in the present invention includes, but not limited to, a signal of a sensor, a result of the signal of the sensors subtracted by a baseline (e.g. a signal when untouched or initial signals), a digitally converted value of said signal or said result of signal subtracted by baseline or said value converted in any other ways. In other words, sensing information can be in the form of a signal status, a status that is converted from any electrical signal or can be converted into electrical signal recorded in a storage medium (e.g. a register, a memory, a magnetic disk, an optical disk), including but not limited to analog or digital information.

Sensing information can be provided by two 1-D sensing information on different axes. The two 1-D sensing information can be used to represent the sensing information on a first axis (e.g. vertical axis) and a second axis (e.g. horizontal axis) on the touch sensitive device. They are used for position detection on the first and second axes, respectively, i.e. providing 1-D positions on the first and second axes or further constructing a 2-D position. In addition, the two 1-D sensing information can also be used for triangulation based on the distances between sensors to detect a 2-D position on the touch sensitive device.

Sensing information can be 2-D sensing information that consists of a plurality of 1-D sensing information on the same axis. The 2-D sensing information can represent signal distribution on a 2-D plane. For example, a plurality of 1-D sensing information on the vertical axis and a plurality of 1-D sensing information on the horizontal axis can represent a signal matrix, such that position detection can be achieved by watershed algorithm or other image processing methods.

In an example of the present invention, the sensing area on the touch sensitive device includes an overlapping range of a first 2-D detecting range detected by at least one first sensor and a second 2-D detecting range detected by at least one second sensor. One with ordinary skill in the art may also recognize that the sensing area can be an overlapping range of three or more 2-D detecting ranges.

For example, the detecting range of a single sensor can be a 2-D detecting range. A sensor (e.g. CCD or CMOS sensor) with camera-based optical detection or a piezoelectric sensor with surface acoustic wave detection obtains 1-D sensing information in the 2-D detecting range. The 1-D sensing information can be comprised of information sensed at a plurality of continuous time points, which correspond to different angles, positions or ranges. In addition, the 1-D sensing information can be generated according to images obtained (e.g. by CCD-CMOS sensor) within a time interval.

Furthermore, for example, the 2-D sensing range can consist of detecting ranges of a plurality of sensors. For example, the detecting range of each infrared photoreceptor, capacitive or resistive conductive bar or strip, or inductive U-shape coil is a fan or stripe shaped detecting range towards one axis. The detecting ranges of a plurality of sensors arranged on the same axis on a line segment (straight or curved) can form a 2-D detecting range of that axis, which can be a square or fan-shaped planar or are detecting range, for example.

In a preferred example of the present invention, the sensing area on the touch sensitive device includes a 2-D range detected by a plurality of sensors on the first and second axes. For example, through self-capacitive detection, a driving signal is provided to a plurality of first sensors, and capacitive-coupling signals or changes in said signal in a 2-D detecting range of these first sensors are sensed to obtain first 1-D sensing information. Furthermore, a driving signal is provided to a plurality of second sensors, and capacitive-coupling signals or changes in said signal in a 2-D detecting range of these second sensors are sensed to obtain second 1-D sensing information.

In another example of the present invention, the sensing area on the touch sensitive device involves a plurality of sensors detecting a plurality of 1-D sensing information in a 2-D sensing range to construct 2-D sensing information. For example, when a signal source sequentially applies a driving signal to sensors on a first axis, signal(s) of at least one of sensors in a second axis is sequentially detected or on a plurality of sensors (partially or all) are simultaneously detected to obtain 2-D sensing information on the axis, wherein the sensors are adjacent or not adjacent but neighboring sensors on the second axis. For example, in mutual-capacitive detection or analog matrix resistive detection, a plurality of sensors constitute a plurality of sensing areas for detecting sensing information at each respective area. For example, a plurality of first sensors (e.g. a plurality of first conductive lines) and a plurality of second sensors (e.g. a plurality of second conductive lines) intersect with each other to from a plurality of overlapping regions. When a driving signal is sequentially provided to each of the first sensors, corresponding to the first sensor being driven by the driving signal, signal(s) or changes in signal(s) on at least one of the second sensors on the second axis is sequentially detected or on a plurality of the second sensors (partially or all) on the second axis are simultaneously detected to obtain 1-D sensing information corresponding to that first sensor. By collecting 1-D sensing information corresponding to each of the first sensors together, 2-D sensing information can be constructed. In an example of the present invention, 2-D sensing information can be regarded as an image.

One with ordinary skill in the art can appreciate that the present invention can be applied to touch sensitive display, for example, a display attached with aforementioned resistive, capacitive, surface acoustic wave, or other touch detection device (or referred to as touch sensitive device). Thus, sensing information obtained by the touch sensitive display or device can be regarded as touch sensitive information.

In an example of the present invention, a touch sensitive device may use continuous signals from different time points, that is, composite signal continuously detected by one sensor or simultaneously by a plurality of sensors. For example, the touch sensitive device may be inductive and continuously scan coils thereon to emit electromagnetic waves. Meanwhile, sensing information is detected by one or more sensors on an electromagnetic pen and continuously compounded to form a signal. This signal is then converted into a plurality of continuous signal values by an ADC. Alternatively, electromagnetic waves are emitted by an electromagnetic pen or electromagnetic waves from an inductive touch sensitive device are reflected, and sensing information is obtained by a plurality of sensors (coils) on the touch sensitive device.

Touch Related Sensing Information

When an external object (e.g. a finger) touches or approaches a touch sensitive device, electrical characteristic or changes will be generated by sensing information at an area corresponding to the touch or proximity of the object. The larger the electrical characteristic or changes, the closer it is to the center (e.g. centroid, center of gravity of center of geometry) of the external object. Continuous sensing information can be regarded as constituted by a plurality of continuous values whether it is digital or analog. The center of the external object may correspond between one or two values. In the present invention, a plurality of continuous values can be spatially or temporally continuous.

Figure 1B:
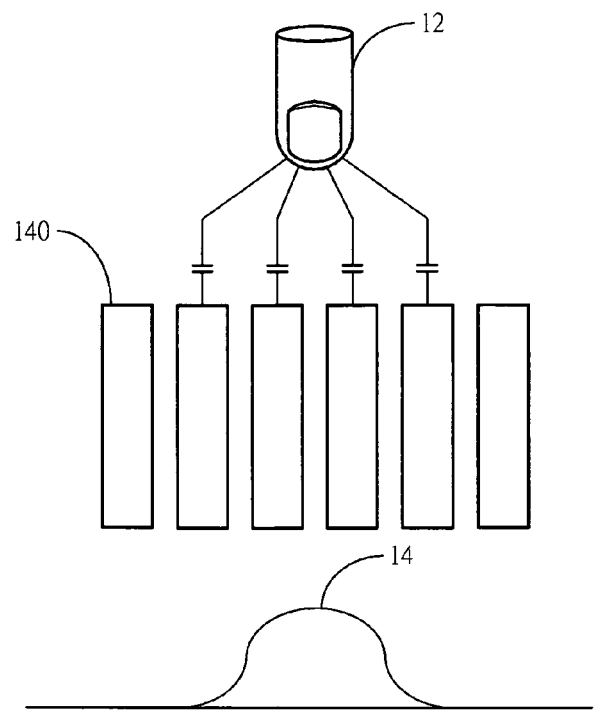
FIG. 1B is a schematic diagram illustrating prior-art signal values.

A first type of 1-D sensing information provided by the present invention is in the form of a plurality of continuous signal values, which can be signal values detected by a plurality of sensors in a time interval, by a single sensor in a continuous time interval or by a single sensor in a single time interval at different detecting locations. In the process of representing sensing information as signal values, signals from respective sensors, time intervals or locations are sequentially converted into signal values, or part or all of sensing information is obtained, thereafter, respective signal values are then analyzed. When an external object touches or draws near to a sensing device, continuous signal values of 1-D sensing information can be those as shown in FIG. 1B. Position touched by the external object corresponds to the peak 14 of the sensing information, wherein peak 14 may reside between two signal values. As described earlier, the present invention does not limit the form of sensing information. Signal values can be another form of the signals of the sensors. For brevity of the description, the present invention below is described in the context of implementations of the signal values. One with ordinary skill in the art may appreciate the implementations of signals from the implementations of signal values.

A second type of 1-D sensing information provided by the present invention is in the form of a plurality of continuous differences, compared to the signal values above, each difference is the difference of a pair of signal values, and the sensing information represented by a plurality of differences can be regarded as differential sensing information. In the present invention, differential sensing information can be obtained directly during sensing, for example, simultaneously or continuously obtaining a plurality of signals, each difference being generated based on a differential signal corresponding to a pair of sensor, time intervals, or locations. The differential sensing information can be generated based on the original sensing information including a plurality of signal values generated previously. As described earlier, the present invention does not limit the form of sensing information. Differences can be another form of the differential signals. For brevity of the description, the present invention below is described in the context of implementations of the differences. One with ordinary skill in the art may appreciate the implementations of differential signals from the implementations of differences.

Figure 1C:
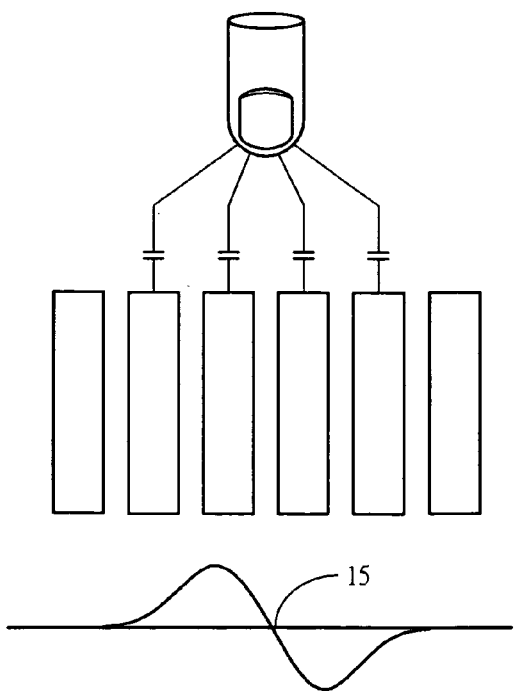
FIG. 1C is a schematic diagram illustrating differences according to the present invention.

In an example of the present invention, a difference can be the difference between a pair of adjacent or not adjacent signal values, for example, the difference between a signal value and its immediately preceding signal value, or between a signal value and its following signal value. In another example of the present invention, the difference can be the difference between non-adjacent signal values. When an external object touches or draws close to the touch sensitive device, continuous differences of 1-D sensing information can be those shown in FIG. 1C, wherein the position of the external object corresponds to zero-crossing 15 of the sensing information. Zero-crossing 15 may reside between two signal values. In an example of the present invention, on the touch sensitive device, the location of each difference is the middle of the two corresponding signal values.

A third type of 1-D sensing information provided by the present invention is in the form of a plurality of continuous dual differences, compared to the signal values and differences above, each dual difference can be the sum or difference of the difference for a first pair of signal values and the difference for a second pair of signal values, that is, the sum or difference of the differences of two pairs of signal values. For example, two pairs of signal values include a first signal value, a second signal value, a third signal value, and a fourth signal value. The dual difference for these four signals is (second signal value–first signal value)+(third signal value–fourth signal value), (second signal value–first signal value)–(fourth signal value–third signal value), (first signal value–second signal value)+(fourth signal value–third signal value) or (first signal value–second signal value)–(third signal value–fourth signal value). In addition, sensing information represented by continuous dual differences can be regarded as dual-differential sensing information. In the present invention, a dual difference is not limited to being provided after signal values or differences, but can also be provided through the sum or difference after subtraction of two pairs of signals upon sensing information being provided, providing dual differential signal similar or equivalent to the sum or difference of the differences between two pair of signal values. As described earlier, the present invention does not limit the form of sensing information. Dual differences can be another form of the dual differential signals. For brevity of the description, the present invention below is described in the context of implementations of the dual differences. One with ordinary skill in the art may appreciate the implementations of dual differential signals from the implementations of dual differences.

Figure 1D:
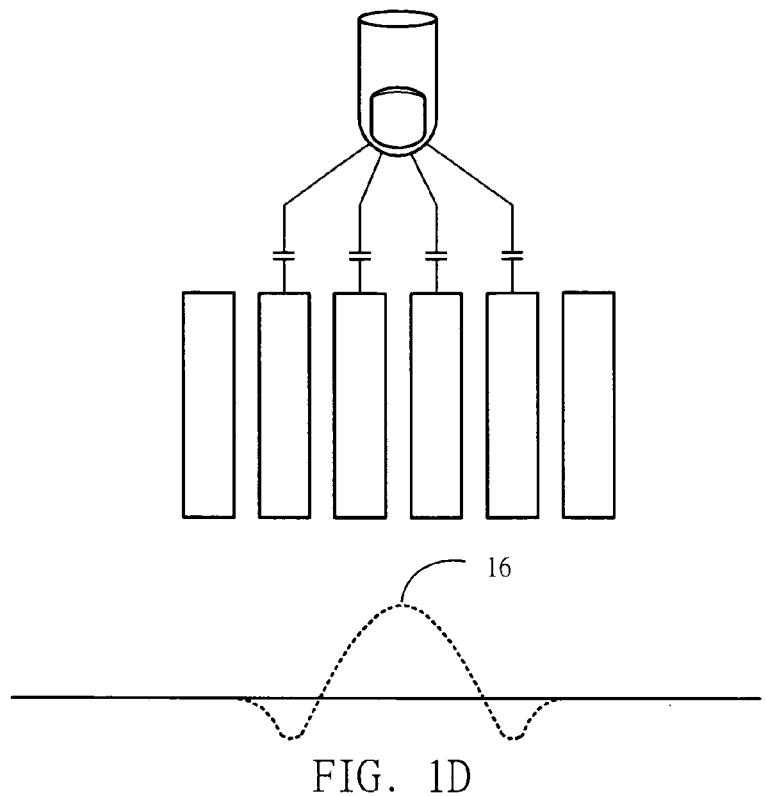
FIGS. 1D and 1E are schematic diagrams illustrating dual differences according to the present invention.
Figure 1E:
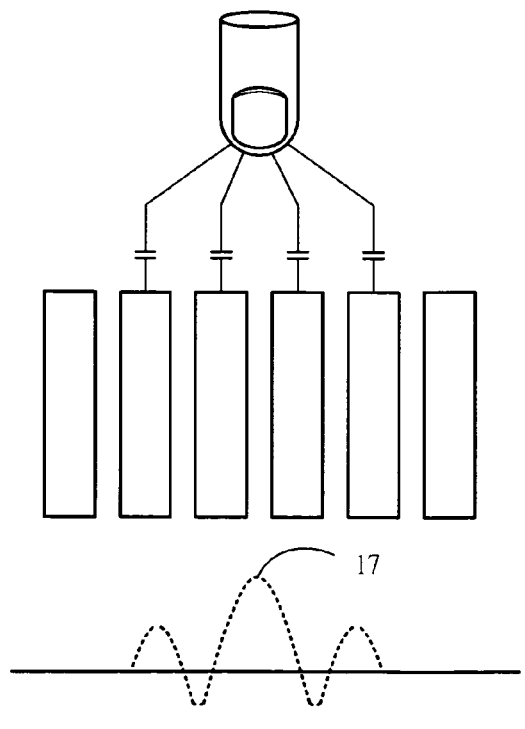

In an example of the present invention, when the external object touches or approaches the touch sensitive device, two pairs of signal values are constituted by three adjacent or non-adjacent signal values. In an example of the present invention, the differences between the prior two signal values and the latter two signal values are a first difference and a second difference, respectively, and the dual difference is the difference between the first difference and the second difference, wherein the first difference and the second difference both can be the results of the preceding signal value minus the following signal value or the following signal value minus the preceding signal value. In another example of the present invention, the differences between the first two signal values and the last two signal values are a first difference and a second difference, respectively, and the dual difference is the sum of the first difference and the second difference, wherein one of the first difference and the second difference is the result of the preceding signal value minus the following signal value, whereas the other one of the first difference and the second difference is the result of the following signal value minus the preceding signal value. For example, two pairs of signal values include a first signal, a second signal, and a third signal. The dual difference for these three signal values is (second signal value–first signal value)+(second signal value–third signal value), (second signal value–first signal value)–(third signal value–second signal value), (first signal value−second signal value)+(third signal value−second signal value), or (first signal value−second signal value)−(second signal value−third signal value). When two pairs of signal values are constituted by three adjacent signal values, and an external object touches or approaches the touch sensitive device, the continuous dual differences of 1-D sensing information can be those shown in FIG. 1D, wherein the position of the external object corresponds to middle peak 16 of the sensing information. Middle peak 16 may reside between two signal values. When two pairs of signal values are constituted by three non-adjacent signal values, and an external object touches or approaches the touch sensitive device, the continuous dual differences of 1-D sensing information can be those shown in FIG. 1E, wherein the position of the external object corresponds to middle peak 17 of the sensing information. Middle peak 17 may reside between two signal values.

In the present invention, sensing information corresponding to respective sensor, time interval or position can be signals detected by the sensors. When the signals are analog, it can be converted into digital signal values by an ADC. Thus, the above difference can also be the value of the difference between a pair of signals, for example, value converted from a pair of signals subtracted via a differential amplifier. Similarly, the above dual difference can also be the value converted from two pairs of signals subtracted via a differential amplifier and then added (or subtracted) together. One with ordinary skill in the art can appreciate that the difference and dual difference described by the present invention not only include being generated by signals or signal values, but also include temporary states of records (electrical, magnetic or optical records), signals or signal values during hardware or software implementations.

In other words, sensing information can be signals, differential signals (e.g. difference between a pair of signals), dual differential signals (e.g. sum or difference of two pairs of signals) on or between the sensors, and signal values, differences, dual differences (analog-to-digital converted signal values, differences or dual differences) can be another form. Signals and signal values, differential signals and differences, and dual differential signals and dual differences are sensing information represented at different stages. In addition, for brevity of the description, touch related sensing information mentioned herein broadly refers to sensing information corresponding to touch or proximity of an external object, such as original touch related sensing information, differential touch related sensing information and dual-differential touch related sensing information.

One with ordinary skill in the art can appreciate that in the case of differences or dual differences, zero-crossing is between at least one positive value and at least one negative value that is between a pair of positive and negative values. The difference or dual difference that corresponds to the touch or proximity of the external object may be an alternating continuous combination of at least one positive value and at least one negative value, wherein at least one zero value is interposed between the at least one positive value and at least one negative value. In most cases, the difference or dual difference that corresponds to the touch or proximity of the external object is an alternating continuous combination of multiple positive values and multiple negative values, wherein zero-crossings between positive and negative values may be at least a zero value or between two values.

In contrast, touch related signal values include a plurality of continuous non-zero values, or an independent non-zero value not adjacent to other non-zero values. In some cases, an independent non-zero value not adjacent to other non-zero values may be generated by noise, which should be identified and neglected by thresholding or other types of mechanisms.

Since noise could generate zero-crossing similar to the touch or proximity of an external object when large, thus in an example of the present invention, values that fall within a zero-value range will be treated as zero values. Difference or dual difference corresponding to the touch or proximity of an external object is an alternating continuous combination of multiple values above a positive threshold and multiple values below a negative threshold, wherein a zero-crossing between a value above the positive threshold and a value below a negative threshold may be at least one zero value or between two values.

In summary of the above, differential touch related sensing information and dual-differential touch related sensing information are alternating continuous combinations of at least one positive value and at least one negative value including a zero-crossing, wherein the zero-crossing can be at least one zero value or between the positive and negative values. In other words, a plurality of continuous zero values between positive and negative values in the differential touch related sensing information and dual-differential touch related sensing information are treated as zero-crossings, or one of which is treated as a zero-crossing.

In an example of the present invention, touch related sensing information is set to begin with at least a positive or negative value, and from there an alternating continuous combination of at least one positive value and at least one negative value including a zero-crossing is searched, wherein the zero-crossing may be at least one zero value or between positive and negative values. In differential touch related sensing information, alternating combinations of at least one positive value and at least one negative value occur symmetrically, and in dual-differential touch related sensing information, alternating combinations of at least one positive value and at least one negative value do not occur symmetrically. In an example of the present invention, touch related sensing information is continuous non-zero values, e.g. a plurality of continuous non-zero signal values.

The at least one positive value above can be regarded as a positive-value set including at least one positive value. Similarly, the at least one negative value above can be regarded as a negative-value set including at least one negative value. Thus, the above alternating combination can be a combination of two sets: a positive-value set and a negative-value set, or a combination of three or more set with alternating positive-value and negative-value sets. In an example of the present invention, at least one zero value may exist between zero, one, or multiple positive-value and negative-value sets.

System Framework

In order to more clearly illustrate how sensing information of the present invention is generated, the present invention uses a capacitive touch sensitive device as an example, and one with ordinary skill in the art can readily recognize other applications such as in resistive, infrared, surface acoustic wave, or optical touch sensitive devices.

Figure 1F:
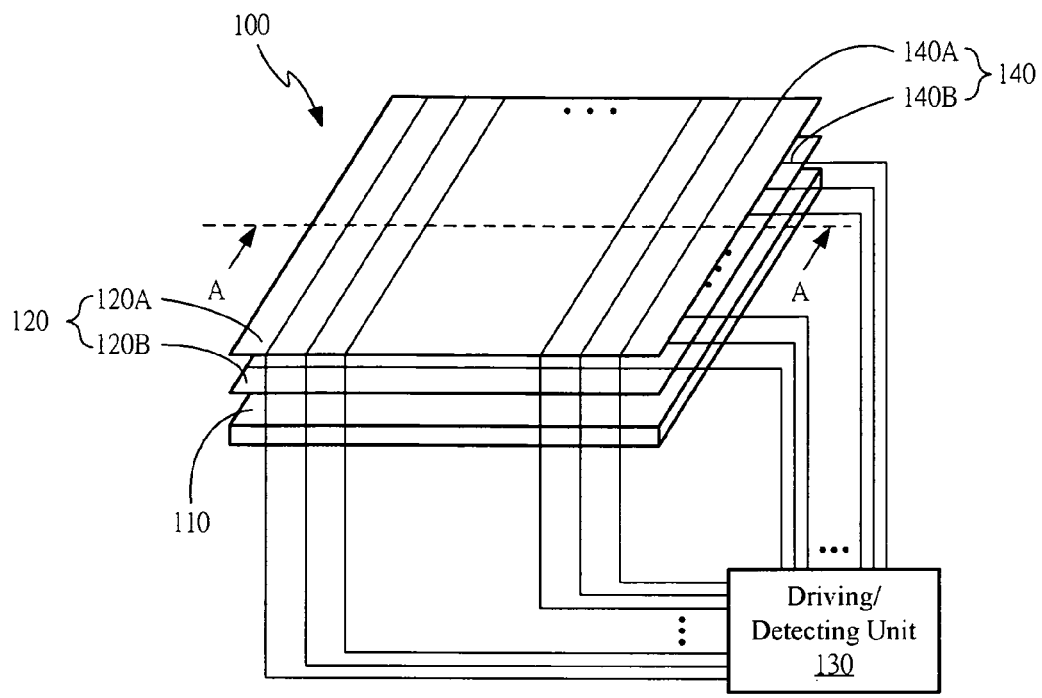
FIG. 1F is a schematic diagram illustrating a sensing device according to the present invention.

Referring to FIG. 1F, the present invention provides a position detecting device 100. As shown, the device includes a sensing device 120 and a driving/detecting unit 130. Sensing device 120 has a sensing layer. In an example of the present invention, the sensing layer can include a first sensing layer 120A and a second sensing layer 120B. First and second sensing layers 120A and 120B each has a plurality of sensors 140, wherein first sensors 140A of first sensing layer 120A cross upon second sensors 140B of second sensing layer 120B. In another example of the present invention, first and second sensors 140A and 140B are disposed in a co-planar sensing layer. Driving/detecting unit 130 produces sensing information based on signals of sensors 140. In the case of self-capacitive detection, for example, sensors 140 driven are sensed. In the case of mutual-capacitive detection, some of sensors 140 not directly driven by driving/detecting unit 130 are sensed. In addition, sensing device 120 can be disposed on a display 110. An optional shielding layer (not shown) can be interposed between sensing device 120 and display 110.

Figure 1G:
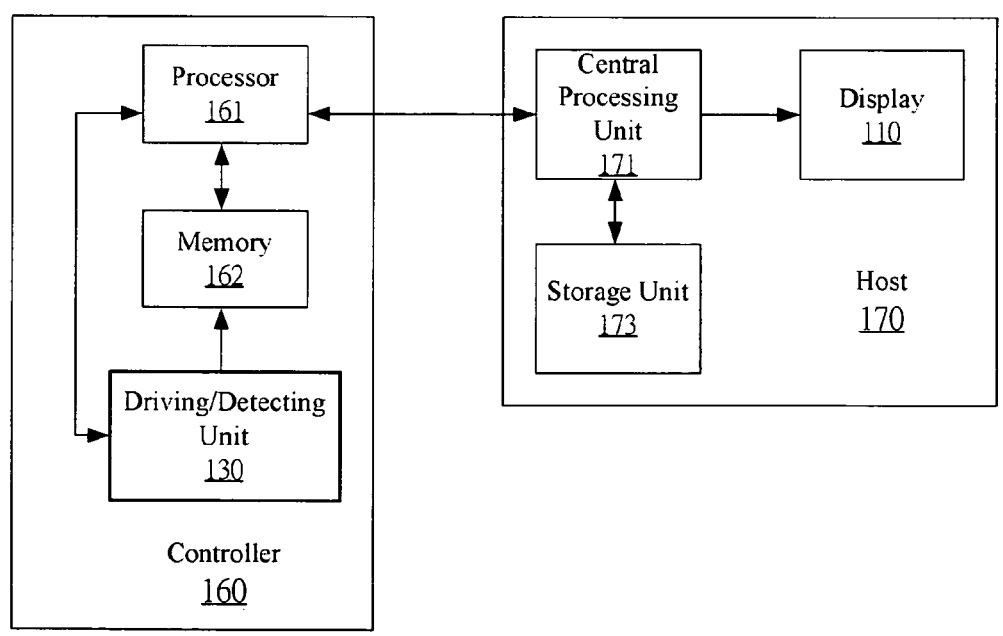
FIG. 1G is a block diagram illustrating functions of a computing system according to the present invention.

The position detecting device 100 of the present invention can be applied to a computing system as shown in FIG. 1G, which includes a controller 160 and a host 170. The controller includes driving/detecting unit 130 to operatively couple sensing device 120 (not shown). In addition, controller 160 can include a processor 161 for controlling driving/detecting unit 130 in generating sensing information. Sensing information can be stored in a memory 162 and accessible by processor 161. Moreover, host 170 constitutes the main body of the computing system, mainly includes a central processing unit 171, a storage unit 173 that can be accessed by central processing unit 171, and display 110 for displaying results of operations.

In another example of the present invention, there is a transmission interface between controller 160 and host 170. The controlling unit transmits data to the host via the transmission interface. One with ordinary skill in the art can appreciate that the transmission interface may include, but not limited to, UART, USB, $I^2C$, Bluetooth, Wi-Fi wireless or wired transmission interfaces. In an example of the present invention, data transmitted can be position (e.g. coordinates), identification results (e.g. gesture codes), command, sensing information or other information provided by controller 160.

In an example of the present invention, sensing information can be initial sensing information generated under the control of processor 161, and position analysis is carried out by host 170, such as position analysis, gesture identification, command identification etc. In another example of the present invention, sensing information can be analyzed by processor 161 first before forwarding determined position, gesture or command etc. to host 170. The present invention does not limit to this example, and one with ordinary skill in the art can readily recognize other interactions between controller 160 and host 170.

Figure 2A:
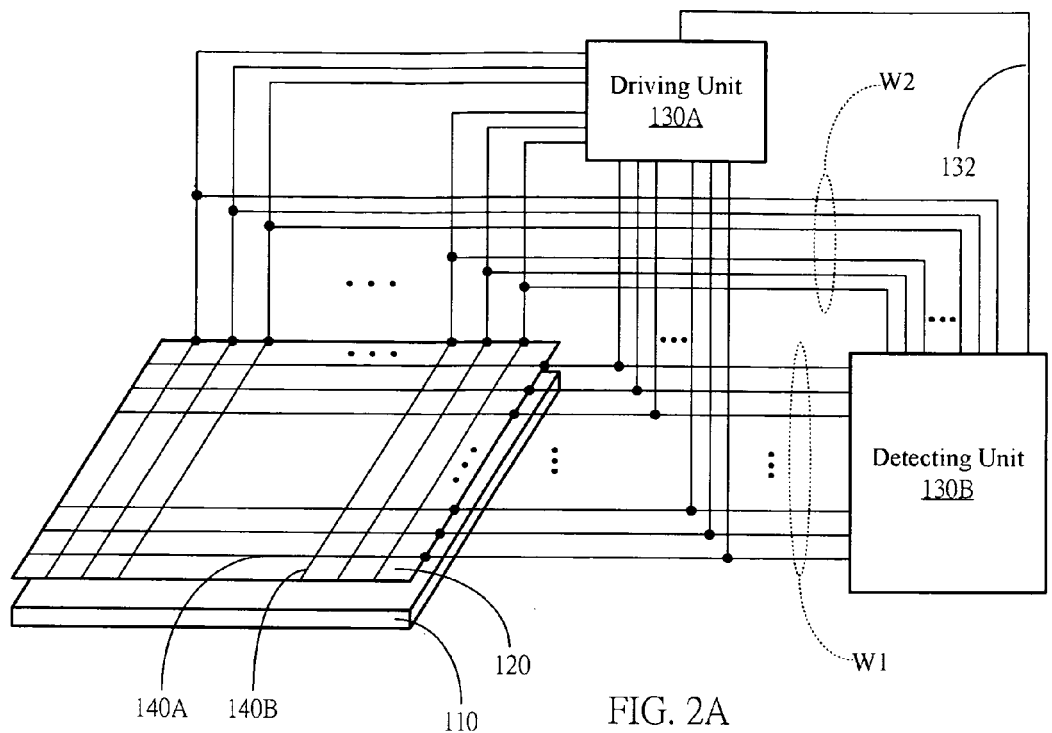
FIGS. 2A and 2B are schematic diagrams illustrating a driving/detecting unit and a sensing device according to the present invention.

Referring to FIG. 2A, in an example of the present invention, driving/detecting unit 130 may include a driving unit 130A and a detecting unit 130B. The plurality of sensors 140 of sensing device 120 are operatively coupled to driving/detecting unit 130 via a plurality of wires. In the example of FIG. 2A, driving unit 130A and detecting unit 130B are operatively coupled to sensors 140A via wires W1 and to sensors 140B via wires W2.

For example, in self-capacitive detection, all sensors 140A are sequentially or simultaneously driven or some of sensors 140A are driven simultaneously in batch by driving unit 130A via wires W1 in a first time period. Sensing information of a first axis (1-D sensing information) is generated via wires W1 by detecting unit 130 based on signals of sensors 140A. Similarly, all sensors 140B are sequentially or simultaneously driven or some of sensors 140A are driven simultaneously in batch by driving unit 130A via wires W2 in a second time period. Sensing information of a second axis (1-D sensing information) is generated via wires W2 by detecting unit 130 based on signals of sensors 140B.

For example, in mutual-capacitive detection, sensors 140B are driven by driving unit 130 via wires W2 in a first time period, and when each sensor 140B is respectively driven, 1-D sensing information corresponding to a first axis of the driven sensors is generated by detecting unit 130B based on signals of sensors 140A via wires W1. These 1-D sensing information on the first axis construct 2-D sensing information (or an image) on the first axis. Similarly, sensors 140A are driven by driving unit 130 via wires W1 in a second time period, and when each sensor 140A is respectively driven, 1-D sensing information corresponding to a second axis of the driven sensors is generated by detecting unit 130B based on signals of sensors 140B via wires W2. These 1-D sensing information on the second axis construct 2-D sensing information (or an image) on the second axis. In addition, driving unit 130A and detecting unit 130B can be synchronized via lines 132 by providing signals. The signals on lines 132 can be provided by said processor 160.

Figure 2B:
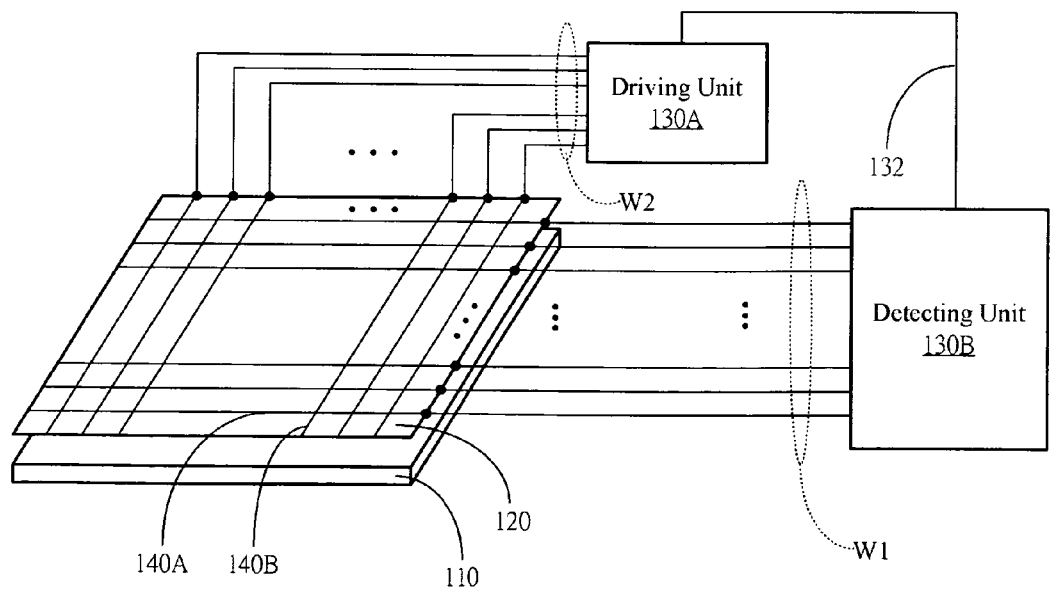

Referring to FIG. 2B, sensor device 120 can also generate 2-D sensing information on only a single axis. In this example, sensors 140B are driven by wires W2, and when each sensor 140B is respectively driven, 1-D sensing information of the driven sensor is generated by detecting unit 130B based on the signals of sensors 140A via wires W1. These 1-D sensing information constitute 2-D sensing information (or an image).

In other words, position detecting device 100 of the present invention is capable of producing 1-D sensing information in 2 axes or 2-D sensing information in 2 axes, producing both 1-D and 2-D sensing information in 2 axes, or producing 2-D sensing information in a single axis. The present invention may include but not limited to said capacitive position detecting device, one with ordinary skill in the art can appreciate other applications, such as in resistive, capacitive, surface acoustic wave, or other touch sensitive device.

Figure 3A:
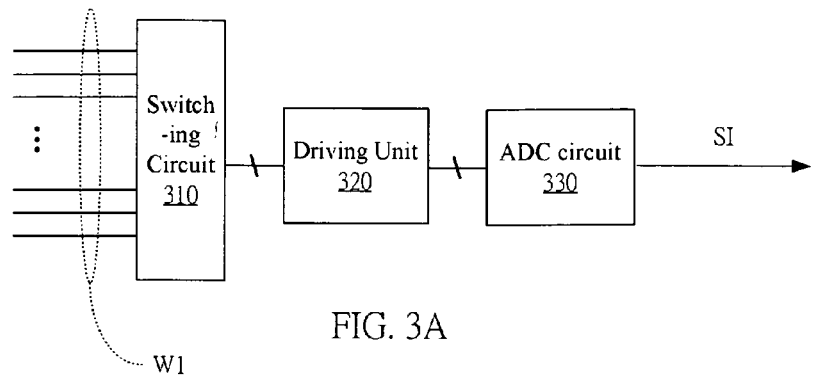
FIG. 3A is a block diagram illustrating functions of a detecting unit according to the present invention.

Referring to FIG. 3A, detecting unit 130B is operatively coupled to the sensing device via wires (e.g. W1). The operative coupling can be achieved by a switching circuit 310, which can be one or more electrical elements such as multiplexers and/or switches. One with ordinary skill in the art can recognize other use of switching circuits. Signals of sensors 140 can be detected by a detecting circuit 320. When signal output by detecting circuit 320 is analog, it is then passed through ADC circuit 330 to generate sensing information SI. Sensing information SI can be analog or digital. In a preferred example of the present invention, sensing information is digital, but the present invention is not limited to the above example. One with ordinary skill in the art can appreciate that detecting circuit 320 and ADC circuit 330 can be integrated in one or more circuits.

Detecting circuit 320 can be comprised of one or more detectors, each receiving a signal from at least one sensor 140 and generating an output. The detectors can be detectors 340, 350 and 360 shown in FIGS. 3B to 3D.

In an example of the present invention, the detection of the signals of sensors 140 can be achieved by an integrator. One with ordinary skill in the art can appreciate other circuits that measure electrical characteristics (e.g. voltage, current, capacitance, induction etc.), such as an ADC, can be applied to the present invention. An integrator can be implemented by an amplifier Cint, which includes an input (e.g. as shown by integrator 322 of FIG. 3B) or a pair of input (e.g. as shown by integrator 324 of FIGS. 3C and 3D) and an output. Output signal can be used by ADC circuit 330 to generate values of sensing information SI, each of these values can be controlled by a reset signal, such as a reset signal Sreset shown in FIGS. 3B to 3D.

Figure 3B:
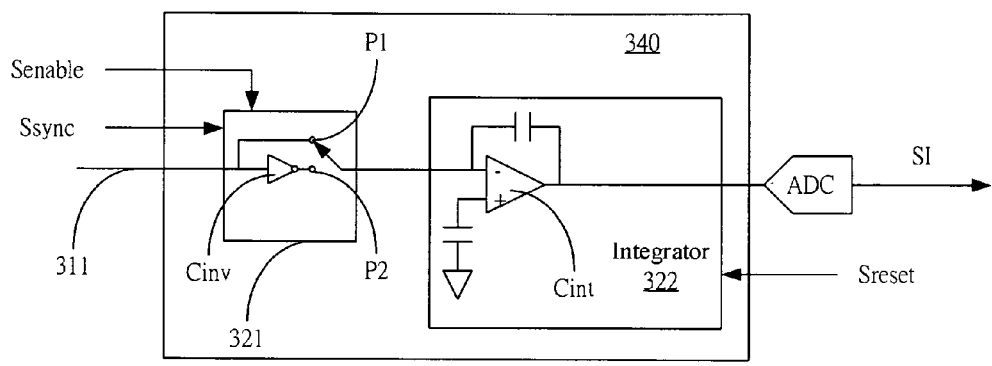
FIGS. 3B to 3D are circuit diagrams illustrating detectors according to the present invention.
Figure 3C:
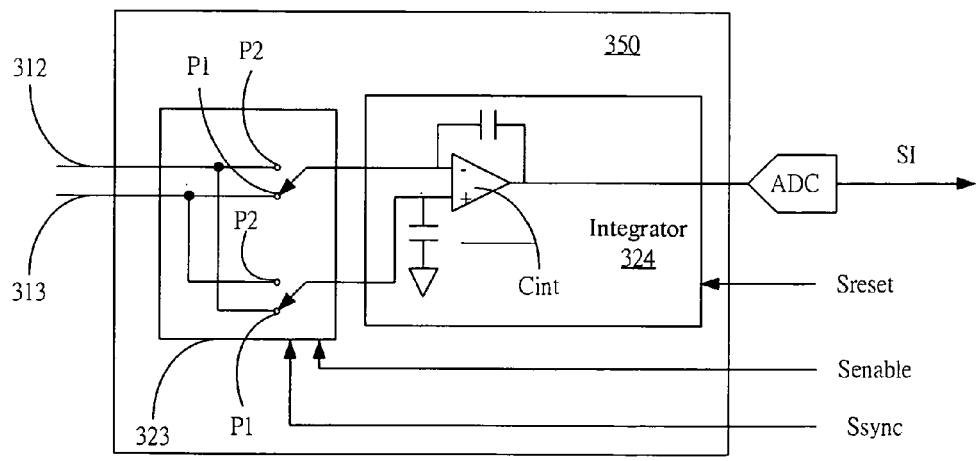

In another example of the present invention, signals of sensors 140 are AC signals that vary with a pair of half cycles. Thus, the detection of the signals of sensors 140 also changes with different half cycles. For example, signals of sensors 140 are detected in the prior half cycle, and inverse signals of sensors 140 are detected in the latter half cycle, or vice versa. Therefore, the detection of the signals of sensors 140 can be controlled by a synchronizing signal Ssync, as shown in FIGS. 3B to 3C. Synchronizing signal Ssync and the signals of sensors 140 are in sync or having the same cycle. For example, synchronizing signal Ssync is used to control one or more switches (e.g. switching circuits 321, 323, 325) to switch between base points P1 and P2, so as to detect the signals of sensor 140 in the prior half cycle, and to detect the inverse signals of sensor 140 in the latter half cycle. In FIG. 3B, the inverse signals are provided by an inverter Cinv.

In yet another example of the present invention, the detection of the signals of sensors 140 is performed in at least a predetermined time interval (or phase) in at least a cycle. Detection can be done in at least an interval in the first half cycle and at least an interval in the second half cycle; or in at least an interval in only the first or second half cycle. In a preferred example of the present invention, at least a preferred time interval in a cycle is scanned as the detection interval, wherein noise interference in this detection interval is smaller than in other intervals. Scanning of the detection interval can be determined by the detection of the signal of at least one sensor in each interval in at least a cycle. Upon determining a detection interval, detection of the signals of sensors is performed only in that detection interval, and this can be controlled by a signal, such as an enable signal Senable in FIGS. 3B to 3D.

Figure 3D:
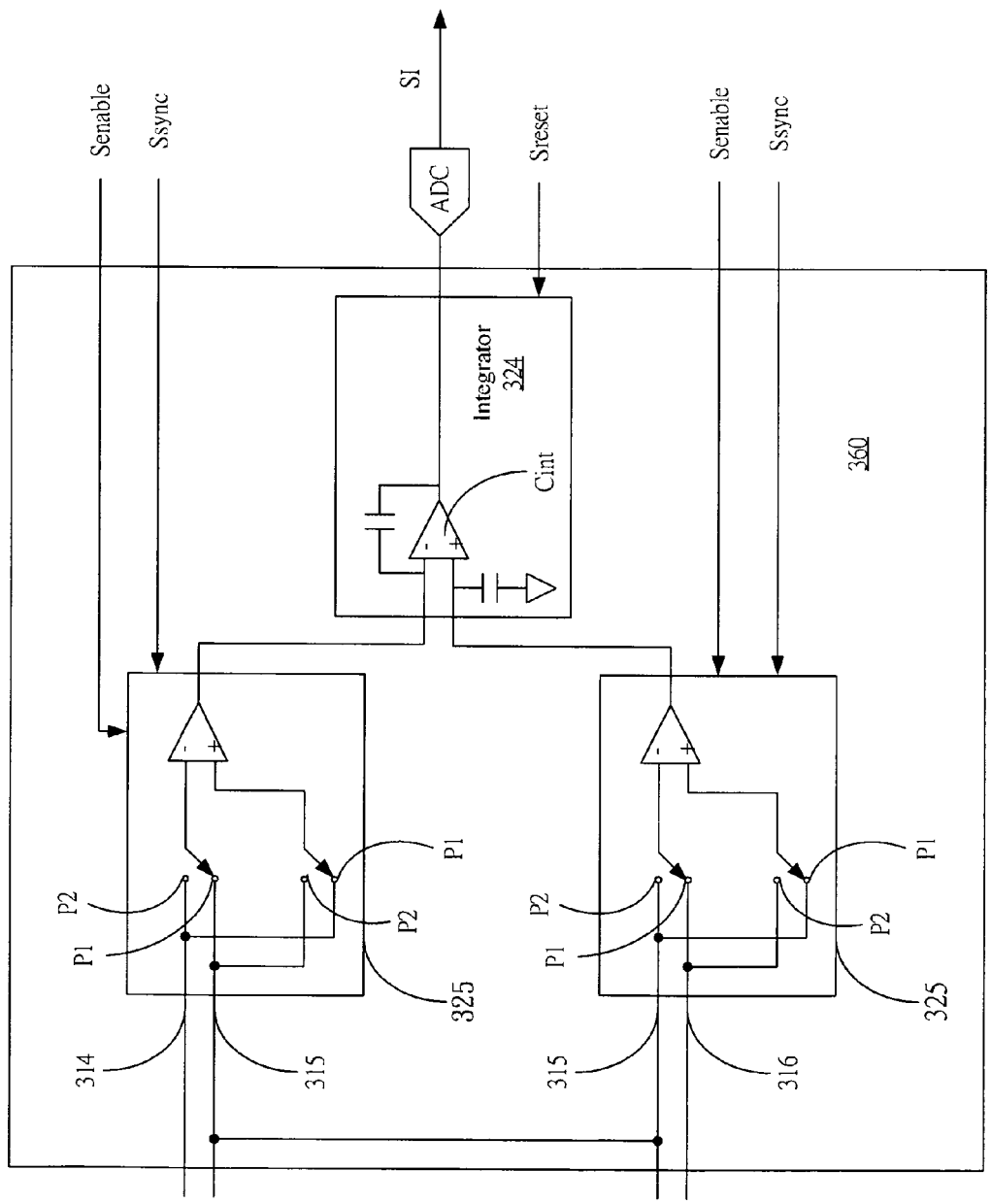

The present invention generates the values of sensing information SI based on the signal of at least one sensor 140. In an example of the present invention, sensing information SI consists of a plurality of signal values. As shown in FIG. 3B, an input 311 is operatively coupled to a sensor 140 for detecting a signal and a signal value of sensing information SI is generated through ADC circuit 330. In another example of the present invention, sensing information SI consists of a plurality of differences. As shown in FIG. 3C, a pair of inputs 312 and 313 are operatively coupled to a sensor 140 for detecting a differential signal and a difference (or single difference) of sensing information SI is generated through ADC circuit 330. In yet another example of the present invention, sensing information SI consists of a plurality of dual differences. As shown in FIG. 3D, three inputs 314, 315 and 316 are operatively coupled to a sensor 140 for detecting a dual differential signal and a dual difference of sensing information SI is generated through ADC circuit 330. A dual differential signal is generated from the difference between a pair of differential signals; each differential signal is generated based on signals of a pair of sensors. In other words, a dual differential signal is generated based on signals of a first pair of sensors and a second pair of sensors, wherein the first pair of sensors are the first two sensors in the three sensors, and the second pair of sensors are the latter two sensors in the three sensors; these three sensors can be adjacent or not adjacent.

In a preferred example of the present invention, detecting circuit 320 includes a plurality of detectors, which simultaneously generate all or some values of sensing information SI. As shown in FIGS. 3E to 3J, detecting circuit 320 can comprise of a detector 340, 350 or 360. The output of the detector is then converted into values of sensing information SI by ADC circuit 330.

Figure 3E:
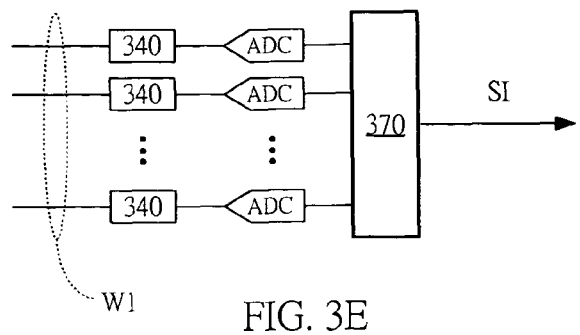
FIGS. 3E to 3J are diagrams showing connections between a detecting circuit and an ADC circuit according to the present invention.
Figure 3F:
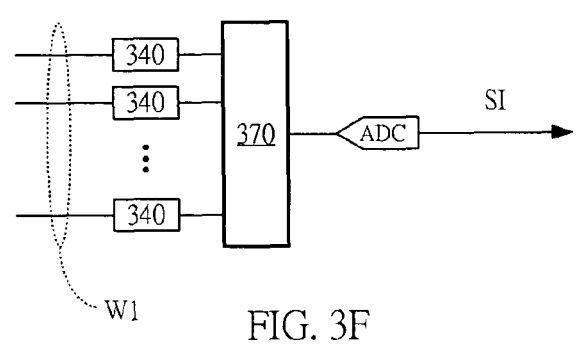
Figure 3G:
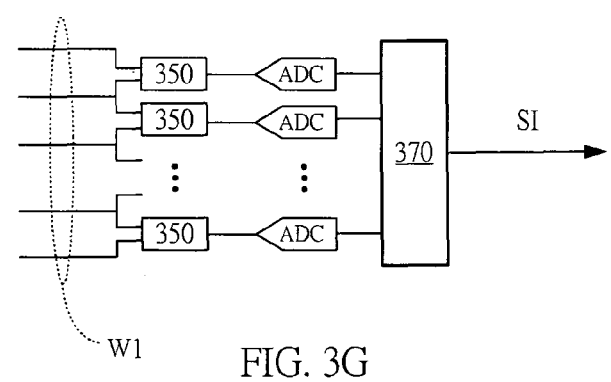
Figure 3H:
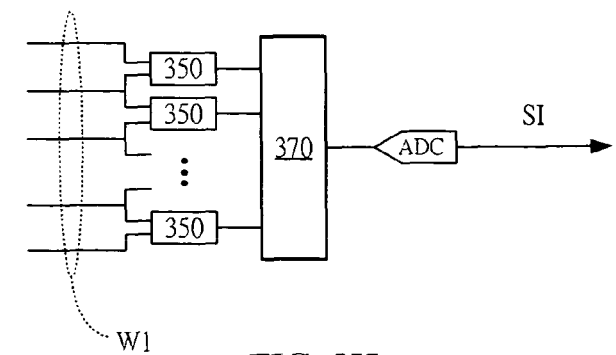
Figure 3I:
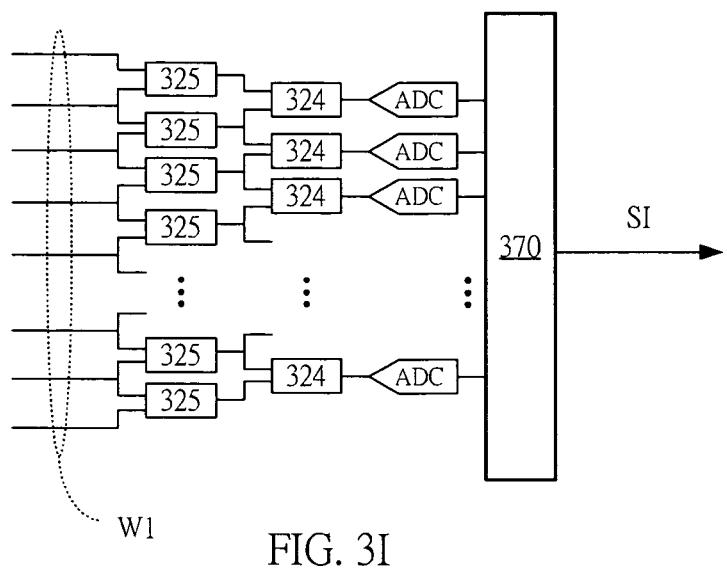
Figure 3J:
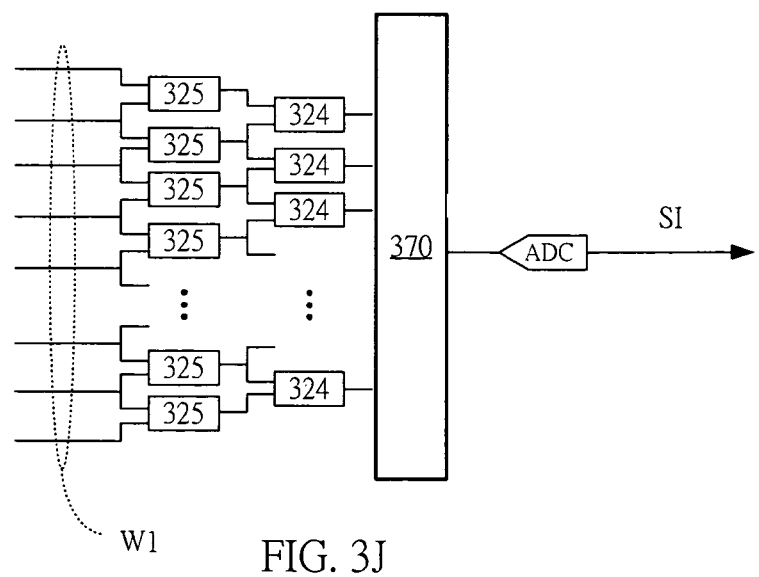

ADC circuit 330 includes at least one ADC. Each ADC may output values of sensing information SI based on an output of only one detector, as shown in FIGS. 3E, 3G and 3I. Alternatively, an ADC may output values of sensing information SI based on outputs of several detectors in turn, as shown in FIGS. 3F, 3H and 3J. Values of sensing information SI can be generated in parallel or in series. In a preferred example of the present invention, values of sensing information SI are generated in series, which can be achieved by a switching circuit 370, for example, by outputting values of sensing information SI from a plurality of ADCs in turn, as shown in FIGS. 3E, 3G, and 3I, or by providing outputs of a plurality of integrators to a single ADC in turn to generate values of sensing information SI, as shown in FIGS. 3F, 3H and 3J.

Accordingly, in an example of the present invention, sensing information SI having a plurality of signal values are generated based on signals of a plurality of sensors, wherein each signal value is generated based on a signal from a sensor, as shown in FIGS. 3B, 3E and 3F. In another example of the present invention, sensing information SI having a plurality of differences are generated based on signals of a plurality of sensors, wherein each difference is generated based on signals from a pair of sensors, as shown in FIGS. 3C, 3G and 3H. In yet another example of the present invention, sensing information SI having a plurality of dual differences are generated based on signals of a plurality of sensors, wherein each dual difference is generated based on signals from three sensors, as shown in FIGS. 3D, 3I and 3J.

In FIGS. 3E to 3J, wires connecting the detectors may include but not limited to wires W1 and wires W2. Connection between an integrator and a wire can be direct or indirect through a switching circuit, as shown in FIG. 3A. In an example of the present invention, values of sensing information are generated by multiple detections by at least a detector of detecting circuit 320. Detecting circuit 320 selects some of the sensors for detection by using switching circuit 310. In addition, only selected sensors are driven by driving unit 130A, for example, in self-capacitive detection. Moreover, only selected sensors and some sensors adjacent to the selected sensors are driven by driving unit 130A.

In a first example of the present invention, the sensing information can be obtained by a dual-differential circuit, which includes: a first-stage differential circuit, a second-stage differential circuit and a measuring circuit, as shown in FIG. 3D, 3I or 3J.

The first-stage differential circuit includes a pair or a plurality of first subtractors (e.g. differential amplifiers in switching circuits 325). Each of first subtractors generates a first-stage differential signal according to a pair of sensors in these sensors.

In addition, the second-stage differential circuit includes a pair or a plurality of first subtractors (e.g. integrators in integrating circuits 324). Each of first subtractors generates a second-stage differential signal according to a pair of first-stage differential signals in these first-stage differential signals.

Further, the measuring circuit may be an ADC circuit as shown FIG. 3A, a combination of integrator 324 and an ADC circuit as shown in FIG. 3D, or a combination of a plurality of integrator 324, ADC circuits and a switching circuit 370 as shown in FIG. 3I. Moreover, the measuring circuit measures these second-stage differential signal at one or a plurality of time points to generate the sensing information. As shown in FIG. 3D or FIG. 3J, these second-stage differential signals are measured at a plurality of time points, or as shown in FIG. 3I, these second-stage differential signals are measured at a single time point.

In FIGS. 3D, 3I and 3J of the present invention, differential integrators 324 are used for simultaneous subtraction and measurement of signals, wherein the subtraction of signals can further include generating a digital value using an ADC circuit. The drawings and descriptions given above are merely examples of the present invention; the present invention is not limited to these. One with ordinary skill in the art can recognize that signal subtraction and measurement can be performed by different circuits, for example, first by a subtractor then an integrator, which will not be described further in details.

In said dual-differential circuit, each value of the sensing information is generated by one of these second-stage differential signals, and each of the second-stage differential signals is generated by a first differential signal and a second differential signal of a pair of first-stage differential signals, wherein the first differential signal is generated based on a signals of a first sensor and a second sensor of these sensors, and the second differential signal is generated based on a signals of the second sensor and a third sensor of these sensors. In other words, each value of the sensing information corresponds to signals of three sensors in these sensors.

In a second example of the present invention, the sensing information can be obtained by a differential circuit, which includes: one or a plurality of subtractors and a measuring circuit, as shown in FIG. 3C, 3G or 3H. In these subtractors, each subtractor generates a differential signal according to signals of a pair of sensors. The measuring circuit measures these differential signals to generate a differential sensing information, wherein each value of the sensing information is the difference of a pair of values of the differential sensing information.

Further, the measuring circuit may measure these differential signals at one or a plurality of time points to generate the sensing information. As shown in FIG. 3C or FIG. 3H, these differential signals are measured at a plurality of time points, or as shown in FIG. 3G, these differential signals are measured at a single time point.

In FIG. 3C, 3G or 3H of the present invention, the subtractors and a portion of the measuring circuit can be implemented by integrator 324. The drawings and descriptions given above are merely examples of the present invention; the present invention is not limited to these. One with ordinary skill in the art can recognize that signal subtraction and measurement can be performed by different circuits, for example, first by a subtractor then an integrator, which will not be described further in details.

In addition, each value of the sensing information is generated by the difference of a first difference and a second difference of the differential signals, wherein the first difference is generated based on a signals of a first sensor and a second sensor of these sensors, and the second difference is generated based on a signals of the second sensor and a third sensor of these sensors. In other words, each value of the sensing information corresponds to signals of three sensors in these sensors.

In a third example of the present invention, the sensing information can be obtained by a measuring circuit, as shown in FIG. 3B, 3E or 3F. The measuring circuit measures signals of these sensors to generate an initial sensing information. The sensing information is generated according to the initial sensing information, wherein each value of the sensing information is generated from three values of the initial sensing information.

Further, the measuring circuit may measure these signals at one or a plurality of time points to generate the initial sensing information. As shown in FIG. 3B or FIG. 3F, these signals are measured at a plurality of time points, or as shown in FIG. 3E, these signals are measured at a single time point.

Each value of the sensing information is the difference or sum of the first difference and a second difference, wherein the first difference is the difference between two prior values of three values of the initial sensing information, and the second difference is the difference between two latter values of the three values of the initial sensing information. In other words, the three values of the initial sensing information are a first value, a second value and a third value. Each value of the sensing information is (second value−first value)−(third value−second value), (first value−second value)−(second value−third value), (second value−first value)+(second value−third value), or (first value−second value)+(third value−second value). Each value of the initial sensing information is generated according to signals of one of these sensors, that is, each value of the initial sensing information corresponds to signals of three sensors of these sensors.

In an example of the present invention, each touch related sensing information of the sensing information has two zero-crossings, and a position touched or approached by an external object is determined by each touch related sensing information. In another example of the present invention, the touch related sensing information is at the beginning or end portion of the sensing information, an external object only approaches or touches the edges of the active region of the touch-detection device. In this case, there will not be two zero-crossings, and exception handling is required.

Moreover, said time points may include but not limited to via one or more clocks, or portions of one or more clocks.

Furthermore, the obtaining and generation of said sensing information can be implemented by controller 160. Said dual-differential circuit, differential circuit and measuring circuit can also be implemented by the controller 160.

In the present invention, sensors can consist of a plurality of conductive sheets and wires, such as a set of rhombic or square conductive sheets connected together by wires. Structurally, conductive sheets of first sensors 140A and second sensors 140B may be arranged in different or same planes. For example, an insulating or piezoresistive layer can be interposed between first and second sensing layers 120A and 120B, wherein the piezoresistive layer is made from anisotropic conductive gel. Moreover, for example, conductive sheets of first sensors 140A and second sensors 140B are substantially arranged in the same plane, with the wires of first sensors 140A bridging over the wires of second sensors 140B. In addition, pads can be disposed between the wires of first sensors 140A and second sensors 140B. These pads can be made of insulating or piezoresistive materials.

Thus, in an example of the present invention, each sensor is responsible for a sensing range. There are a plurality of sensors, including a plurality of first sensors and a plurality of second sensors. The sensing ranges of these first sensors are parallel to each other, while the sensing ranges of these second sensors are parallel to each other. The parallel sensing ranges of the first and second sensors intersect to form an intersecting matrix. For example, the first and second sensors are two lines of infrared receivers arranged horizontally and vertically for sensing horizontal scanning ranges and vertical scanning ranges, respectively. The horizontal and vertical scanning ranges form an intersecting matrix. The horizontal and vertical scanning ranges are implemented by several lines of intersecting capacitive or resistive sensors.

Conversion of Sensing Information

The signal values, differences and dual differences of the sensing information can be converted into one another. In a first conversion method provided by the present invention, continuous signal values are converted into continuous differences; each difference being the difference between a pair of adjacent or non-adjacent signal values.

In a second conversion method provided by the present invention, continuous signal values are converted into continuous dual differences; each dual difference being the sum or difference between two pairs of signal values.

In a third conversion method provided by the present invention, continuous differences are converted into continuous signal values; each difference is added to all the preceding or following differences to obtain a corresponding signal value, thereby constructing continuous signal values.

In a fourth conversion method provided by the present invention, continuous differences are converted into continuous dual differences; each dual difference is the sum or difference of a pair of adjacent or non-adjacent differences.

In a fifth conversion method provided by the present invention, continuous dual differences are converted into continuous differences; each dual difference is added to all the preceding or following dual differences to obtain a corresponding difference, thereby constructing continuous differences.

In a sixth conversion method provided by the present invention, continuous dual differences are converted into continuous signal values. In an example of the present invention, each dual difference is added to all the preceding dual differences to obtain a corresponding difference, thereby constructing continuous differences, and thereafter each difference subtracts all the following differences to generate a corresponding signal value, thereby constructing continuous signal values. In another example of the present invention, each dual difference subtracts all the preceding dual differences to obtain a corresponding difference, thereby constructing continuous differences, and thereafter each difference is added to all the following differences to generate a corresponding signal value, thereby constructing continuous signal values.

Adding all the preceding or following differences or dual differences to generate a corresponding signal value or difference is performed by forward or backward accumulation.

These conversion methods may include but not limited to the conversion of 1-D sensing information, one with ordinary skill in the art can appreciate that the above conversion methods can be applied to 2-D sensing information or 3-D (or even more dimensional) sensing information. In addition, one with ordinary skill in the art can appreciate that the above conversion methods can be performed by said controller 160 or host 170.

Accordingly, in an example of the present invention, a first form of sensing information (e.g. 1-D or 2-D sensing information) detected is converted into sensing information for position analysis. In another example of the present invention, a first form of sensing information is converted into a second form of sensing information, and then the second form of sensing information is converted into sensing information for position analysis, for example, continuous dual difference is converted to continuous signal values.

One-Dimension Position Analysis

A first type of position analysis provided by the present invention involves analyzing the position of a zero-crossing based on a plurality of differences in sensing information as the corresponding position of an external object. One with ordinary skill in the art can recognize that position analysis may include but not limited to determination of the touch or proximity of an object, that is, determination of a corresponding position of an external object may include but not limited to the touch or proximity of the object.

In an example of the present invention, a pair of neighboring differences including a positive and a negative value is searched, that is, a pair of positive and negative values at both sides of a zero-crossing, and then the position of the zero-crossing in this pair of neighboring differences is then determined, for example, a slope is determined based on this pair of adjacent differences to infer the position of the zero-crossing. In addition, order of the positive and negative values can be used in conjunction for determining the position of the zero-crossing. Said pair of neighboring differences can be directly adjacent to each other, or not adjacent and with at least one zero value between them. In addition, a pair of neighboring differences with a predetermined order of arrangement can be searched for, for example, a pair of neighboring differences with a positive value appearing first and followed by a negative value is searched for.

In another example of the present invention, a threshold is used for determining the starting position of the search. From there, a pair of neighboring differences including a positive and a negative value is searched for, and then the position of a zero-crossing is determined based on the found pair of neighboring differences. One with ordinary skill in the art can appreciate that in the case that sensing information is represented by differences, when sensing information corresponding to the touch or proximity of an external object is above a positive threshold or below a negative threshold, the searching using these threshold values may include but not limited to the determination of the touch or proximity of the external object. In other words, whenever sensing information is above a positive threshold or below a negative threshold, it can be determined that there is a zero-crossing in the sensing information that corresponds to a touch or proximity of an external object.

For example, a threshold generates binary values corresponding to positive differences. For example, a difference smaller than a threshold (e.g. positive threshold) is represented by 0 or false, and a difference larger than the threshold is represented by 1 or true, and the position of a 1 or true in adjacent differences 10 is regarded as the starting position for a backward search of a zero-crossing. Similarly, a difference larger than a threshold (e.g. negative threshold) is represented by 0 or false, and a difference smaller than the threshold is represented by 1 or true, and the position of a 1 or true in adjacent differences 01 is regarded as the starting position for a forward search of a zero-crossing.

Figure 4A:
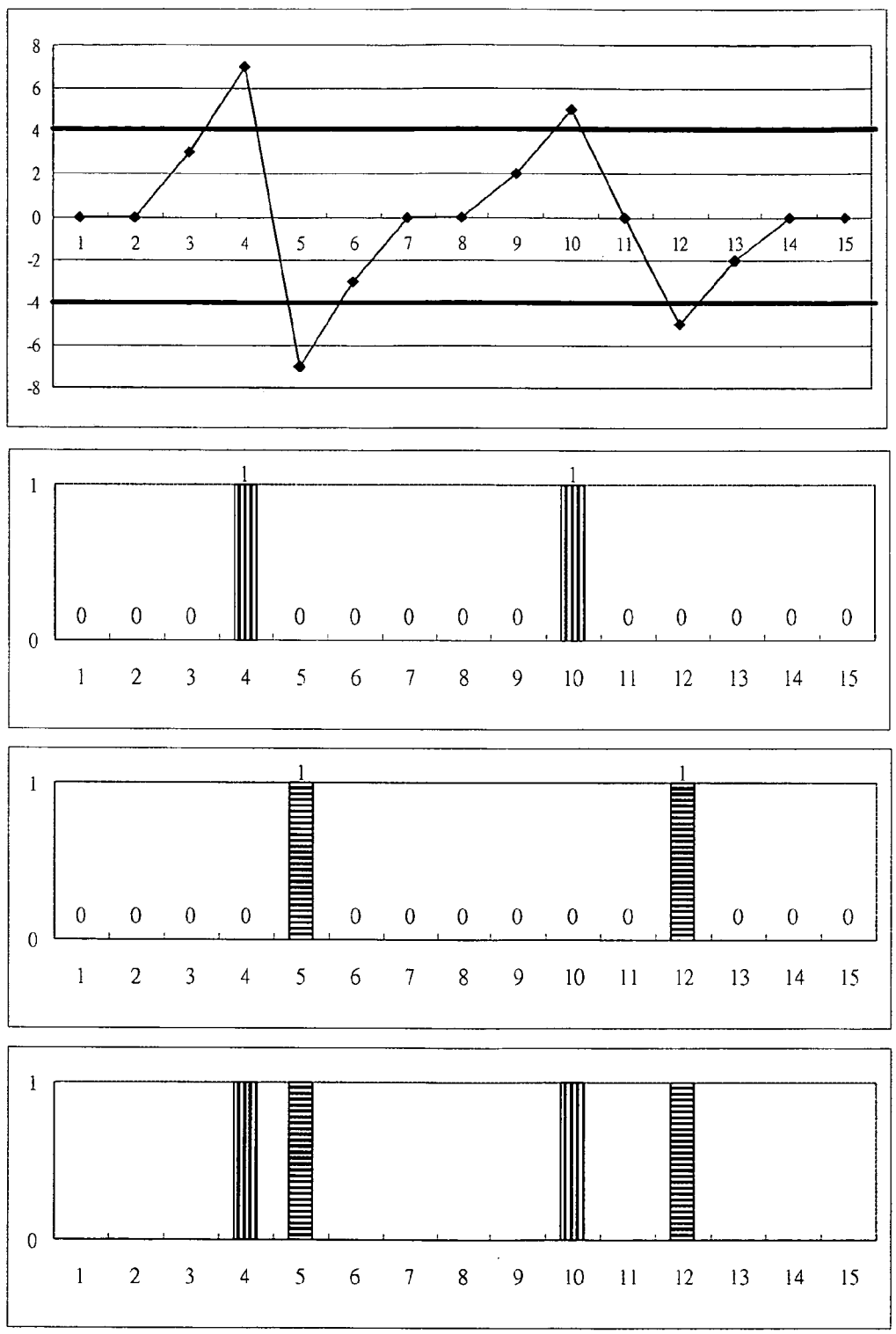
FIG. 4A is a diagram illustrating position detection using binary differences according to the present invention.
Figure 4B:
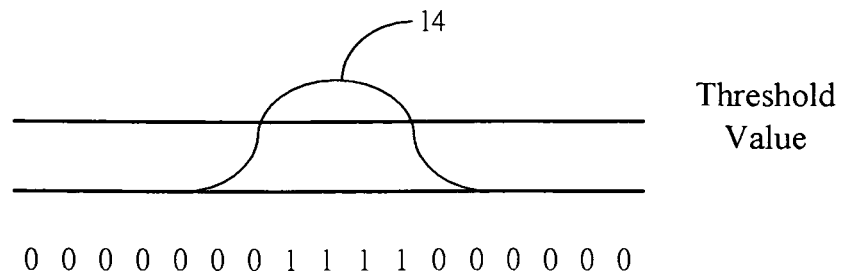
FIGS. 4B to 4D are diagrams illustrating examples for detecting centroid positions according to the present invention.
Figure 4C:
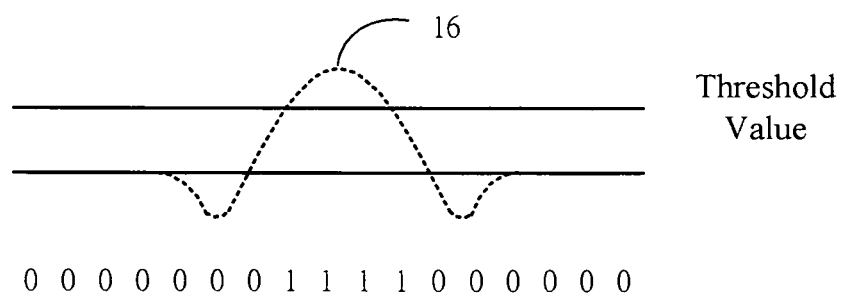

For example, Table 1 and FIG. 4B are examples of using threshold for determining touch or proximity of an external object.

TABLE 1

| Index | Signal Value | Difference | First Binary Difference (T1 = 4) | Second Binary Difference (T2 = −4) |
|---|---|---|---|---|
| 1 | 0 | 0 | 0 | 0 |
| 2 | 0 | 0 | 0 | 0 |
| 3 | 0 | 3 | 0 | 3 |
| 4 | 3 | 7 | 1 | 0 |
| 5 | 10 | −7 | 0 | 1 |
| 6 | 3 | −3 | 0 | 0 |
| 7 | 0 | 0 | 0 | 0 |
| 8 | 0 | 0 | 0 | 0 |
| 9 | 0 | 2 | 0 | 0 |
| 10 | 2 | 5 | 1 | 0 |
| 11 | 7 | 0 | 0 | 0 |
| 12 | 7 | −5 | 0 | 1 |
| 13 | 2 | −2 | 0 | 0 |
| 14 | 0 | 0 | 0 | 0 |
| 15 | 0 | 0 | 0 | 0 |

This example includes signal values or difference of 15 sensors and determination results using a positive threshold T1 (e.g. 4) and a negative threshold T2 (e.g. −4). In the determination results using the positive threshold, the starting positions are the 4th and 10th differences, that is, the position of a 1 in adjacent differences 10. In the diagram with vertical-stripe bar, it is found that there are two instances of touch or proximity of external objects. Similarly, in the determination results using the negative threshold, the starting positions are the 5th and 12th differences, that is, the position of a 1 in adjacent differences 01. In the diagram with horizontal-stripe bar, it is found that there are two instances of touch or proximity of external objects. One with skill the art can appreciate that the number of starting position corresponds to the number of instances of touch or proximity of external objects. The present invention does not limit to only two instances of touch or proximity of external objects, but there can be more.

In another example of the present invention, an interval for a zero-crossing is determined using a first threshold and a second threshold, which may include but not limited to touch or proximity of an external object, and then the position of the zero-crossing is searched within this interval. For example, a first threshold produces binary values of positive differences, for example, a difference smaller than the first threshold is represented by 0 or false, and a difference larger than the first threshold is represented by 1 or true, and the position of a 1 in adjacent differences 10 is regarded as the starting position. In addition, a second threshold produces binary values of negative differences, for example, a difference larger than the second threshold is represented by 0 or false, and a difference smaller than the second threshold is represented by 1 or true, and the position of a 1 in adjacent differences 01 is regarded as the end position. Moreover, the starting and end positions are paired to form intervals for searching zero-crossings. In an example of the present invention, a slope is used to determine the zero-crossing between a starting position (e.g. position of a 1 in 10) and an end position (e.g. position of a 1 in 01). One with ordinary skill in the art can appreciate that the starting and end positions are interchangeable. One with ordinary skill in the art can appreciate that touch related sensing information can be determined by regarding the location of 1 in 01 as the starting position and the location of 1 in 10 as the end position.

Take again the example shown in FIG. 4A and Table 1, after pairing, a first search interval is between the 4th and 5th differences, and a second search interval is between the 10th and 12th differences.

One with ordinary skill in the art can appreciate that positive and negative thresholdings can be performed simultaneously (or in parallel). Interval pairing can be carried out by pairing a determined starting position with an end position that determined immediately afterwards.

In an example of the present invention, thresholds can be generated by sensing information. For example, a threshold value can be determined by multiplying a maximum of the absolute values of all differences by a ratio (e.g. a ratio smaller than one, such as 0.9), or a positive threshold value can be determined by multiplying a maximum of all positive differences by a ratio, or a negative threshold value can be determined by multiplying a minimum of all negative differences by a ratio. In other words, a threshold value can be static or dynamic. Thus, when the absolute value of a threshold is relatively large, it is possible that external object is determined when using the positive thresholding but not in the negative thresholding, or vice versa. A larger threshold value is favorable for noise or ghost points filtering, while a smaller threshold value is favorable for avoiding miss of real touch or for determining approaching of external objects.

From the above, it is clear that, corresponding to the same touch or approaching of an object, regardless of a backward search from a starting position identified using a positive threshold value or a forward search from a starting position identified using a negative threshold value, the same zero-crossing will be searched. Thus, in an example of the present invention, search for a zero-crossing starts from starting positions identified using positive and negative threshold values, and the number of external touch or approaching is determined based on the number of zero-crossings found, and then the positions of the zero-crossings are determined. When the values at both sides of a zero-crossing that corresponds to an external touch or approaching are first positive and then negative, the search for zero-crossing is backward from the starting position when using positive thresholding, whereas the search for zero-crossing is forward from the starting position when using negative thresholding, and vice versa. In addition, an external touch or approaching may not always exhibit starting positions in both positive and negative thresholdings.

A second type of position analysis provided by the present invention involves analyzing the position of centroid (position of center of weight or weighted average position) based on a plurality of signal values or dual differences in sensing information as the corresponding position of an external object.

Figure 4D:
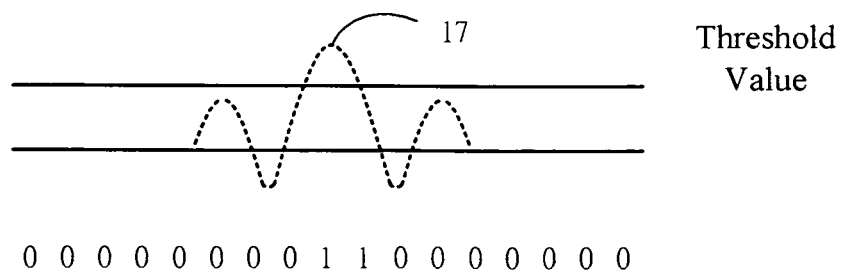

In an example of, the present invention, a threshold value is used to determine the centroid position of signal values or dual differences, as shown in FIGS. 4B and 4D. A threshold can generate binary values corresponding to signal values or dual differences. For example, a signal value or dual difference smaller than a threshold is represented by 0 or false, and a signal value or dual difference larger than the threshold is represented by 1 or true. In this example, a signal value or dual difference represented by 1 or true is used in determining centroid position. One with ordinary skill in the art can appreciate other ways for determining a centroid position of signal values or dual differences using a threshold. For example, a signal value or dual difference represented by 1 or true, as well as a plurality of signal values or dual differences at either side thereof, are used in determining centroid position. As another example, in a continuous series of adjacent signal value or dual difference represented by 1 or true, a number (i) of and a number (j) of signal values or dual differences before and after a signal value or dual difference that is at the center of the series are taken to determine the centroid position.

In another example of the present invention, continuous signal values or dual differences are converted into continuous differences to identify the center signal value or dual difference that corresponds to a zero-crossing, and i and j signal values or dual differences before and after the center signal value or dual difference are used for determining the centroid position.

In another example of the present invention, a zero-crossing is determined by continuous differences, and the continuous differences are converted into continuous signal values or dual differences, and then the center signal value or dual difference that corresponds to the zero-crossing is identified, thereafter, i and j signal values or dual differences before and after the center signal value or dual difference are used for determining the centroid position.

Assuming that using i and j signal values respectively before and after the nth signal value as a centroid calculation range, the centroid position can be determined based on each signal value $C_k$ and its position in the centroid calculation range as follows:

$$C_{centroid} = \frac{\sum_{k=n-i}^{n+j} X_k C_k}{\sum_{k=n-i}^{n+j} C_k}.$$

wherein $X_k$ can be a 1-D coordinate (e.g. X or Y coordinate) or 2-D coordinates (e.g. (X, Y)).

Assuming the difference between the k-1th signal value and the kth signal value is $D_k$, and the kth dual difference is $DD_k = D_{k-1} - D_k = (C_k - C_{k-1}) - (C_{k+1} - C_k) = 2C_k - C_{k-1} + C_{k+1}$, and assuming using i and j signal values respectively before and after the nth dual difference $DD_n$ as a centroid calculation range, the centroid position can be determined based on each dual difference $DD_k$ in the centroid calculation range as follows:

$$DD_{centroid} = \frac{\sum_{k=n-i}^{n+j} X_k DD_k}{\sum_{k=n-i}^{n+j} DD_k}$$

wherein $X_k$ can be a 1-D coordinate (e.g. X or Y coordinate) or 2-D coordinates (e.g. (X, Y)). One with ordinary skill in the art can similarly appreciate the calculation for centroid position when the kth dual difference is $DD_k = (C_k - C_{k-2}) - (C_{k+2} - C_k) = 2C_k - C_{k-2} + C_{k+1}$. This will not be described further.

In another example of the present invention, signal values or dual differences used for determining centroid position is obtained by first subtracting a base value. For example, this base value can be the average of all signal values or dual differences, the average of a plurality of signal values or dual differences at either sides of the signal values or dual differences used for centroid position determination, or the average of a plurality of signal values or dual differences not used for centroid position determination that are adjacent to either sides of the signal values or dual differences used for centroid position determination. One with ordinary skill in the art can recognize other ways of determining the base value. For example, the base value can be determined based on a first ratio of at least one signal value or dual difference at one side and a second ratio of at least one signal value or dual difference at the other side.

Taken the average of the ith signal value $C_{n-i}$ and the jth signal value $I_{n+j}$ respectively before and after the nth signal value as base value $$C_{base(i,j)} \left( C_{base(i,j)} = \frac{C_{n-1} + C_{n+j}}{2} \right),$$

and using i and j signal values respectively before and after the nth signal value as a centroid calculation range, the centroid position can be determined based on each signal value $C_k$ minus the base value $C_{base(i,j)}$ in the centroid calculation range as follows:

$$C_{base(i,j)} = \frac{C_{n-i} + C_{n+j}}{2}$$

-continued $$C_k - C_{base(i,j)} = \frac{2C_k - C_{n-i} - C_{n+j}}{2}$$
$$= \frac{(C_k - C_{n-i})}{2} + \frac{(C_k - C_{n+j})}{2}$$

$$C_{cnetroid} = \frac{\sum_{k=n-i}^{n-i \le k \le n+j} X_k \left( \frac{2C_k - C_{n-i} - C_{n+j}}{2} \right)}{\sum_{k=n-i}^{n-i \le k \le n+j} \frac{2C_k - C_{n-i} - C_{n+j}}{2}}$$

$$= \frac{\sum_{k=n-i}^{n-i \le k \le n+j} X_k (2C_k - C_{n-i} - C_{n+j})}{\sum_{k=n-i}^{n-i \le k \le n+j} (2C_k - C_{n-i} - C_{n+j})}$$

wherein $X_k$ can be a 1-D coordinate (e.g. X or Y coordinate) or 2-D coordinates (e.g. (X, Y)).

A third type of position analysis provided by the present invention involves analyzing the position of centroid (position of center of weight or weighted average position) based on a plurality of differences in sensing information as the corresponding position of an external object.

Assuming the difference between the k-1th signal value $C_{k-1}$ and the kth signal value $C_k$ is $D_k$.

$$(C_k - C_{n-i}) = D_{n-(i-1)} + D_{n-(i-2)} + \ldots + D_k$$
$$(C_k - C_{n+j}) = -(D_{k+1} + D_{k+2} + \ldots + D_{n+j})$$
$$C_k - C_{base(i,j)} = \frac{2C_k - C_{n-i} - C_{n+j}}{2}$$
$$= \frac{(D_{n-(i-1)} + D_{n-(i-2)} + \ldots + D_k) -}{2}$$
$$\frac{(D_{k+1} + D_{k+2} + \ldots + D_{n+j})}{2}$$

$$C_k - C_{base(i,j)} = \frac{\sum_{s=n-(i-1)}^{k} D_s - \sum_{s=k+1}^{n+j} D_s}{2}$$

$$C_{cnetroid} = \frac{\sum_{s=n-i}^{n-i \le k \le n+j} X_s \left( \frac{\sum_{s=n-(i-1)}^{k} D_s - \sum_{s=k+1}^{n+j} D_s}{2} \right)}{\sum_{s=n-i}^{n-i \le k \le n+j} \frac{\sum_{s=n-(i-1)}^{k} D_s - \sum_{s=k+1}^{n+j} D_s}{2}}$$

$$= \frac{\sum_{s=n-i}^{n-i \le k \le n+j} X_k \left( \sum_{s=n-(i-1)}^{k} D_s - \sum_{s=k+1}^{n+j} D_s \right)}{\sum_{s=n-i}^{n-i \le k \le n+j} \left( \sum_{s=n-(i-1)}^{k} D_s - \sum_{s=k+1}^{n+j} D_s \right)}$$

Accordingly, the centroid position $C_{centroid}$ can be calculated based on the differences between the signal values, wherein the differences in the centroid calculation range are $D_{n-(i-1)}, D_{n-(i-2)}, \ldots, D_k, \ldots, D_{k+1}, \ldots, D_{n+j}, D_{n+(j+1)}$. In other words, the centroid position $C_{centroid}$ can be calculated based on the differences in the centroid calculation range.

As an example, assuming 1 signal value before and after the nth signal value are taken for determining the centroid position, differences in the centroid calculation range can be used to calculate it. This is proven as follows:

$$D_{n-1} = C_{n-1} - C_{n-2}$$

$$D_n = C_n - C_{n-1}$$

$$D_{n+1} = C_{n+1} - C_n$$

$$D_{n+2} = C_{n+2} - C_{n+1}$$

$$C_{base(2,2)} = \frac{C_{n-2} + C_{n+2}}{2}$$

$$C_{n-1} - C_{base(2,2)} = \frac{2C_{n-1} - C_{n-2} - C_{n+2}}{2}$$
$$= \frac{D_{n-1} - D_n - D_{n+1} - D_{n+2}}{2}$$

$$C_n - C_{base(2,2)} = \frac{2C_n - C_{n-2} - C_{n+2}}{2}$$
$$= \frac{D_{n-1} + D_n - D_{n+1} - D_{n+2}}{2}$$

$$C_{n+1} - C_{base(2,2)} = \frac{2C_{n+1} - C_{n-2} - C_{n+2}}{2}$$
$$= \frac{D_{n-1} + D_n + D_{n+1} - D_{n+2}}{2}$$

$$C_{centroid} = \frac{X_{n-1}(C_{n-1} - C_{base(2,2)}) + X_n(C_n - C_{base(2,2)}) + X_{n+1}(C_{n+1} - C_{base(2,2)})}{(C_{n-1} - C_{base(2,2)}) + (C_n - C_{base(2,2)}) + (C_{n+1} - C_{base(2,2)})}$$

$$C_{centroid} = \frac{\begin{array}{c}(X_{n-1}(D_{n-1} - D_n - D_{n+1} - D_{n+2}) + \\ X_n(D_{n-1} + D_n - D_{n+1} - D_{n+2}) + \\ X_{n+1}(D_{n-1} + D_n + D_{n+1} - D_{n+2}))\end{array}}{\begin{array}{c}((D_{n-1} - D_n - D_{n+1} - D_{n+2}) + \\ (D_{n-1} + D_n - D_{n+1} - D_{n+2}) + (D_{n-1} + D_n + D_{n+1} - D_{n+2})\end{array}}$$

One with ordinary skill in the art can recognize that taking i and j signal values, differences or dual differences respectively before and after the nth signal value as the centroid calculation range can be applied to determine the signal value, difference or dual difference on the centroid position.

From the above description, it can be seen that the present invention performs position detection by analyzing sensing information that may not only include originally obtained signal values, differences, or dual differences, but also signal values, differences, or dual differences converted from originally obtained sensing information. By analyzing 1-D or 2-D sensing information on two difference axes (e.g. X and Y axes) that corresponds to the same object, that is, by performing 1-D or 2-D position analysis on two different axes, the positions (or coordinates) of the object on these two axes can be obtained, thereby a 2-D position (or 2-D coordinates) can be constructed.

One with ordinary skill in the art can appreciate that operations of the above 1-D position analysis can be performed by said controller 160 or host 170.

Two-Dimension Position Analysis

2-D sensing information can be comprised of a plurality of 1-D sensing information, wherein each 1-D sensing information includes sensing information that corresponds to a plurality of first 1-D positions, and each 1-D sensing information corresponds to a second 1-D position. Thus, 2-D position analysis can at least include 1-D position analysis on a plurality of 1-D touch sensitive information, that is, 2-D position analysis can at least include a plurality of 1-D position analysis.

In addition, in a first example of the present invention, a first 1-D centroid position of any external object on each first dimensional sensing information is a 2-D position (e.g. 2-D coordinates (first 1-D centroid position, second 1-D position of the first dimensional sensing information)), and can be used to calculate a 2-D centroid position of the object (or center of geometry), wherein the weight of each 1-D centroid position can be a signal value or dual difference of the external object on the corresponding first dimensional sensing information (e.g. one or average or interpolation of two signal values or dual differences closest to the 1-D centroid position on the first dimensional sensing information), or sum of signal values or dual differences of the external object on the corresponding first dimensional sensing information.

Thus, 2-D position analysis can perform 1-D position analysis on each first dimensional sensing information, and analyze a 2-D centroid position of each external object based on at least one 2-D position that corresponds to each external object.

In addition, in a second example of the present invention, 2-D position analysis may include performing 1-D position analysis on a plurality of 1-D sensing information on a first axis (or a first dimension), respectively, and based on at least one 1-D position corresponding to each external object on the first axis, analyzing a first 1-D centroid position of each external object on the first axis. Similarly, 2-D position analysis may further include performing 1-D position analysis on a plurality of 1-D sensing information on a second axis (or a second dimension), respectively, and based on at least one 1-D position corresponding to each external object on the second axis, analyzing a second 1-D centroid position of each external object on the second axis. By pairing the first 1-D centroid position on the first axis with the second 1-D centroid position on the second axis for each external object, a 2-D position for each external object can be analyzed.

In other words, 2-D position analysis may include performing 1-D position analysis on 2-D sensing information on two different axes (e.g. 2-D sensing information on the first axis and 2-D sensing information on the second axis) to obtain a 2-D position for each external object.

In addition, in a third example of the present invention, 2-D position analysis may include analyzing 1-D centroid position corresponding to each external object from a plurality of 1-D sensing information on a first axis, and based on a 2-D position corresponding to each 1-D sensing information, determining a 2-D position of each 1-D centroid position that corresponds to each external object on the first axis. 2-D position analysis may further include analyzing 1-D centroid position corresponding to each external object from a plurality of 1-D sensing information on a second axis, and based on a 2-D position corresponding to each 1-D sensing information, determining a 2-D position of each 1-D centroid position that corresponds to each external object on the second axis. 2-D position analysis may further include analyzing a 2-D centroid position based on the 2-D positions of all 1-D centroid positions on the first and second axes that correspond to each external object.

One with ordinary skill in the art can appreciate that 2-D sensing information can determine the position of each external object by image processing, for example, using watershed or other image processing techniques. As another example, watershed algorithm can be used to analyze the position of each watershed, and then the centroid position is calculated using sensing information near each watershed position to obtain a more accurate position.

In a fourth example of the present invention, a plurality of 1-D sensing information originally obtained can be represented by signal values or dual differences, which construct an image (or matrix) formed from 2-D sensing information. Watershed algorithm or other image processing techniques can be used for position analysis. Alternatively, a "connected component" algorithm can be used, which analyzes connected portions in an image to determine an image of each external object, and further determines the position or the type of the object, such as a finger, a palm or a pen.

In a fifth example of the present invention, a plurality of 1-D sensing information originally obtained can be represented by differences, which are then converted into signal values or dual differences, which in turn construct an image (or matrix) formed from 2-D sensing information. Watershed algorithm or other image processing techniques can be used for position analysis.

In a sixth example of the present invention, a plurality of 1-D sensing information originally obtained can be represented by differences. By performing position analysis on each 1-D sensing information, the position of each zero-crossing, as well as the signal value or dual difference on the position of each zero-crossing can be determined, thereby constructing an image (or matrix) formed from 2-D sensing information. Watershed algorithm or other image processing techniques can be used for position analysis.

The dual difference of a zero-crossing point can be generated by two directly adjacent differences, for example, a zero-crossing is between the k-lth difference and the kth difference, and the dual difference at this zero-crossing point is $DD_k = D_{k-1} - D_k$. The signal value of a zero-crossing point can be generated after converting all differences representing the 1-D sensing information into signal values, or generated based on a plurality of differences closest to the zero-crossing. For example, zero-crossing is closest to the nth signal value, and the average of ith signal value $C_{n-i}$ and the jth signal value $I_{n+j}$ before and after the nth signal value is taken as the base value $$C_{base(i,j)}\left(C_{base(i,j)} = \frac{C_{n-i} + C_{n+j}}{2}\right), \text{ and } C_n - C_{base(i,j)} = \frac{2C_n - C_{n-i} - C_{n+j}}{2}$$

is taken as the signal value, then $$C_n - C_{base(i,j)} = \frac{2C_n - C_{n-i} - C_{n+j}}{2}$$
$$= \frac{(D_{n-(i-1)} + D_{n-(i-2)} + \ldots + D_n) - (D_{n+1} + D_{n+2} + \ldots + D_{n+j})}{2}$$

In other words, between the n−(i−1)th difference to the (n+j)th difference, the signal value at zero-crossing can be determined.

In a seventh example of the present invention, a plurality of 1-D sensing information originally obtained can be represented by signal values and dual differences and are then converted to differences. By performing analysis on each 1-D sensing information, the position of each zero-crossing is determined. In conjunction with the signal value or dual difference on each zero-crossing position, an image (or matrix) formed by 2-D sensing information can be constructed. Watershed algorithm or other, image processing techniques can be used for position analysis.

In an eighth example of the present invention, when or in the process of obtaining 2-D sensing information on the first axis, 1-D sensing information on the second axis is also obtained. After performing position analysis on the position of the 2-D sensing information on the first axis, the 1-D position or 2-D position of each external object on the first axis can be obtained. In addition, after performing position analysis on the position of the 2-D sensing information on the second axis, the 1-D position of each external object on the second axis can be obtained. The 1-D position on the second axis can be paired up with the 1-D position on the first axis to form a 2-D position, or can be used to replace or correct the position on the second axis in the 2-D position on the first axis.

One with ordinary skill in the art can appreciate that the operations of the above 2-D position analysis can be performed by said controller 160 or host 170. In addition, in an example of the present invention, the 1-D distance or 2-D distance between each 1-D centroid position corresponding to the same touch or approach and at least one other 1-D centroid position corresponding to the same touch or approach is within a threshold. In another example of the present invention, the weight of each 1-D centroid position corresponding to the same touch or approach is greater than a threshold.

In the following description, a touch related sensing information can be a touch related sensing information or one of multiple touch related sensing information in a sensing information. Operations related to touch related sensing information can be applied not only to specific touch related sensing information but also to all touch related sensing information of the present invention.

Figure 5A:
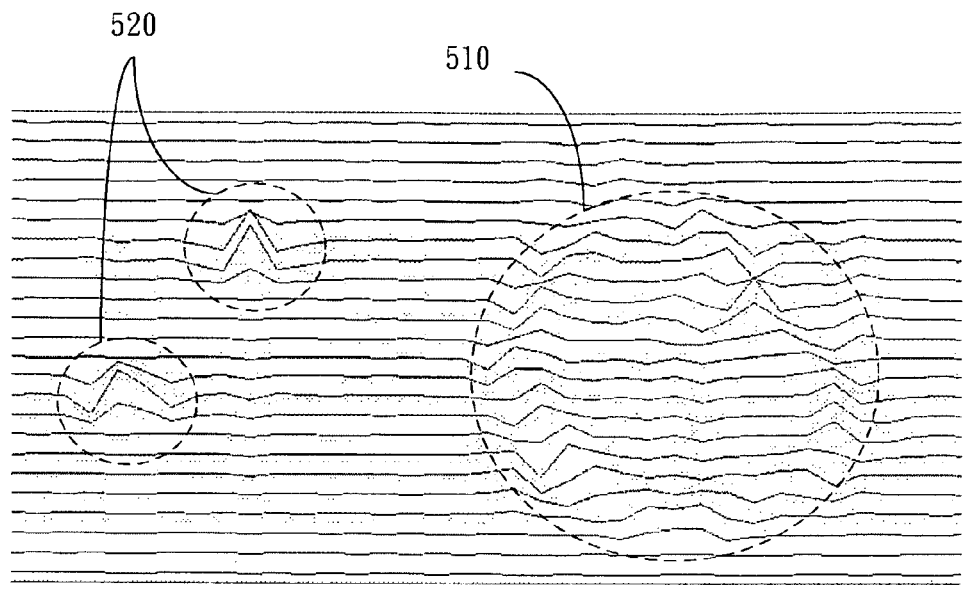
FIGS. 5A and 5B are schematic diagrams depicting basins and hills according to the present invention.
Figure 5B:
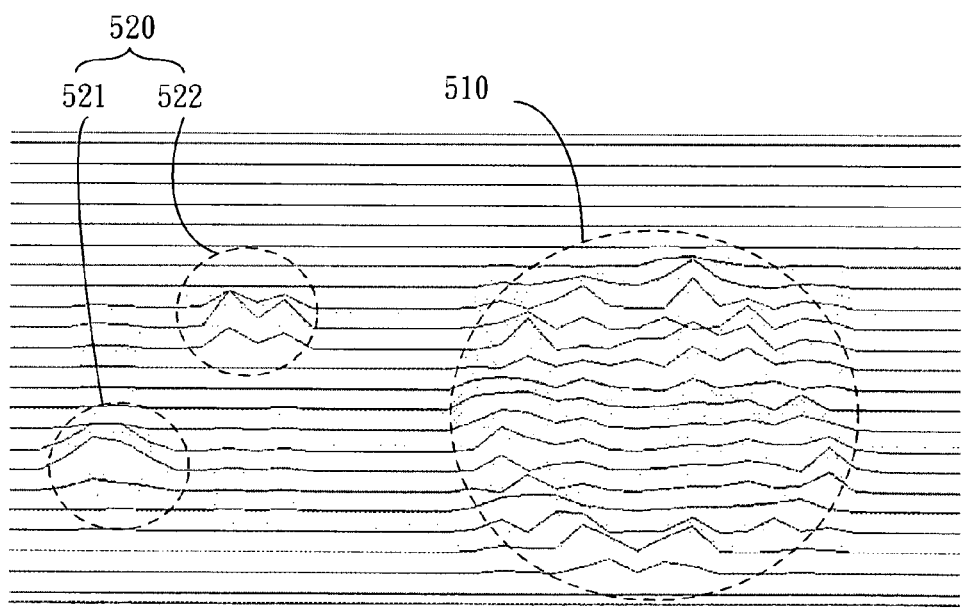

In addition, for convenient description, in numerous diagrams and descriptions of the present invention, explanations are given in terms of positive values. One with ordinary skill in the art can appreciate that same principles are applicable to sensing information after having swapped its positive and negative values with each other. The 2-D sensing information proposed by the present invention can be partial sensing information with inner lower values within outer high values, as shown by a basin 510 in FIGS. 5A and 5B. In an example of the present invention that includes a plurality of dual differences as 2-D sensing information, when an external object touches a large area, in the corresponding touch related sensing information, locations closer to the center of the area will exhibit depressions (smaller values) relative to surrounding higher locations (larger values). In another example of the present invention that includes a plurality of differences as 2-D sensing information in which all negative values are converted to positive values, when the area touched by an external object is larger than a certain degree, in the corresponding touch related sensing information, locations closer to the middle of the area will exhibit depressions (smaller values) relative to surrounding higher locations (larger values).

If they are viewed as topographic relief, partial sensing information with lower inner values within higher external values may be regarded as a valley or basin area in the 2-D sensing information, including higher and lower places surrounding a valley or basin. For example, it can be a valley surrounded by one or more mountains, e.g. a basin surrounded by mountains or canyon, or a mountain or a plateau with a depressed top. Sensing information with inner lower values within outer high values can be one or more openings, e.g. a canyon open at both ends. In 2-D sensing information that includes a plurality of dual differences, touch related sensing information may also include a trench surrounding a valley.

In contrast, partial sensing information with inner higher values within outer low values may be a hill or a plateau with one or more peaks. Each peak is a partial sensing information with inner higher values within outer low values, wherein the peak are higher locations (larger values) relative to other surrounding lower locations (small values), as illustrated by basins 510 shown in FIGS. 5A and 5B. In an example of the present invention, a hill with several peaks corresponds to neighboring partial sensing information inner lower values within outer high values.

For example, in 2-D sensing information that includes a plurality of signal values, touch related sensing information that contains partial sensing information with inner higher values within outer low values can be a hill (smaller range) or a plateau (larger range). Similarly, 2-D sensing information that includes a plurality of dual differences or differences in which all negative values have been converted into positive values can also include a hill or a plateau.

In an example of the present invention, partial sensing information with inner lower values within outer high values and partial sensing information with inner higher values within outer low values are touch related sensing information. In another example of the present invention, a plateau is regarded as a larger hill, and a basin is regarded as a valley without or fewer openings. In yet another example of the present invention, touch related sensing information that is not a valley or a basin is a hill, or that is not a hill is a valley or a basin.

In addition, when 2-D sensing information includes a plurality of differences in which all negative values are converted into positive values, two adjacent sensing information with inner higher values within outer low values are regarded as at the same touch related sensing information.

In the following descriptions, a basin is used to represent partial sensing information with inner lower values within outer high values, and a hill is used to represent partial sensing information with inner higher values within outer low values for the sake of convenience, and the present invention is not limited to these aspects. One with ordinary skill in the art can appreciate other aspects of partial sensing information with inner lower values within outer high values and partial sensing information with inner higher values within outer low values.

Figure 6A:
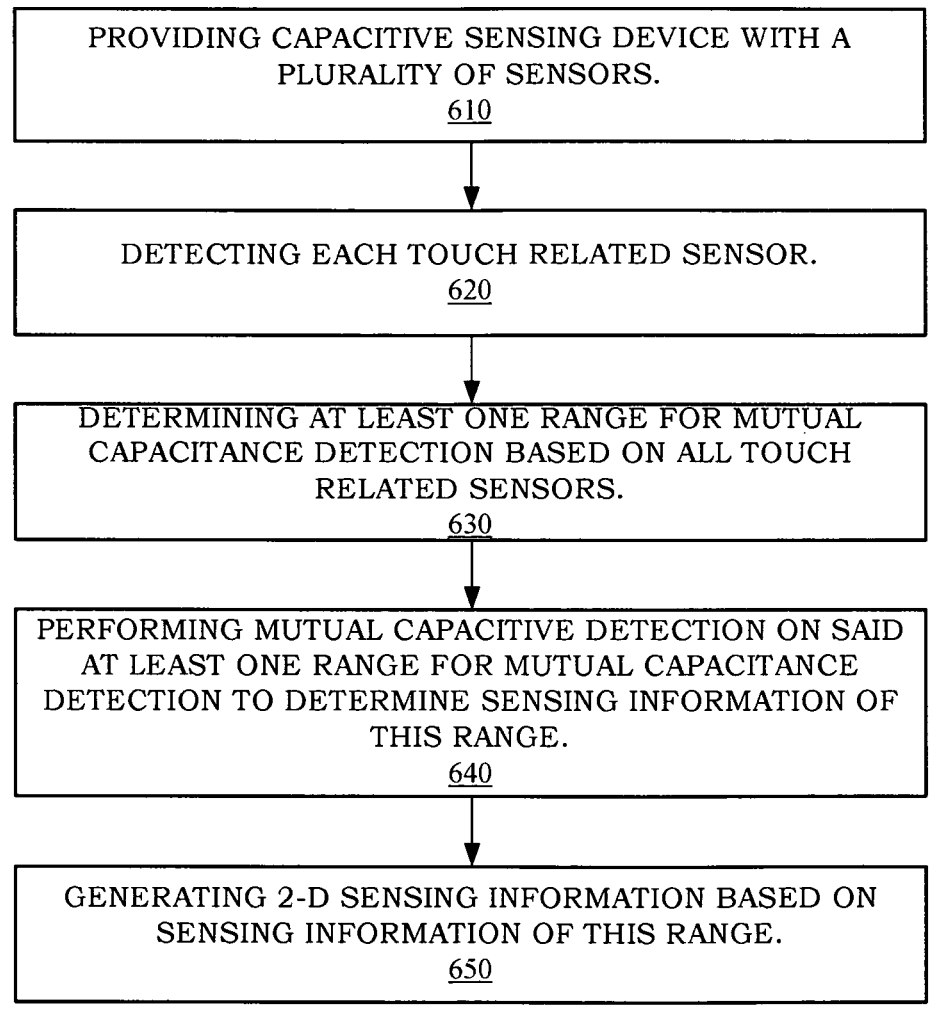
FIGS. 6A and 6B are flowcharts illustrating a method for capacitive position detection according to a first embodiment of the present invention.

In a first embodiment of the present invention, a method for capacitive position detection according to the best mode of the present invention is provided and shown in FIG. 6A. First, in step 610, a capacitive sensing device with a plurality of sensors is provided; these sensors include a plurality of first sensors and a plurality of second sensors, wherein these first and second sensors overlap on a plurality of overlapping points. Next, in step 620, each touch related sensor is detected. Then, in step 630, at least one range for mutual capacitance detection is determined based on all the touch related sensors. Thereafter, in step 640, a mutual capacitive detection is performed on said at least one range for mutual capacitance detection to determine a sensing information of this range. Next, in step 650, a 2-D sensing information is generated based on the sensing information of this range.

In step 620, touch related sensors can be determined from self capacitance detection. For example, self capacitance detection is performed on all the first sensors to determine touch related first sensors. Touch related second sensors can be determined in a similar manner. In addition, touch related sensors can be determined from mutual capacitance detection. For example, when all of the first sensors are simultaneously driven by a driving signal, signals of the second sensors are sequentially or simultaneously detected to determine touch related second sensors. Furthermore, when all of the first sensors are simultaneously driven by a driving signal, signals of the first sensors are sequentially or simultaneously detected to determine touch related first sensors.

Figure 6B:
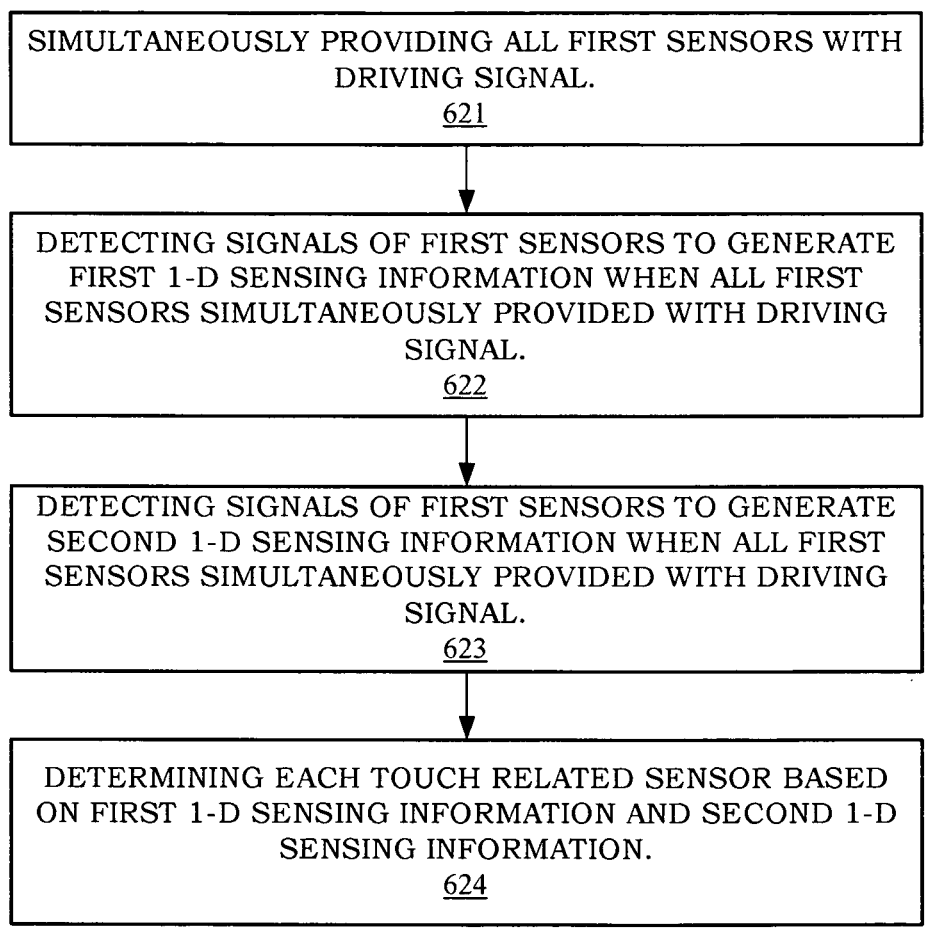

Detection of each touch related sensors is shown in FIG. 6B. First, in step 621, all of the first sensors are simultaneously provided with a driving signal. Then, as shown in steps 622 and 623, when all of the first sensors are simultaneously provided with a driving signal, signals of these first sensors are detected to generate a first 1-D sensing information, and signals of these first sensors are detected to generate a second 1-D sensing information. Thereafter, in step 624, each touch related sensor is determined based on the first 1-D sensing information and the second 1-D sensing information.

1-D sensing information can be determined from the signals of all of the first sensors or the signals of all of the second sensors. Based on each touch related sensing information on the 1-D sensing information, a touch related sensor corresponding to each touch related sensing information can be determined. For example, touch related sensing information shown in FIG. 1B, 1C, 1D or 1E is determined from 1-D sensors, and touch related sensors are determined accordingly.

In an example of the present invention, a touch related sensor can be a sensor that includes a plurality of zero values corresponding to either side of the touch related sensing information. For example, when the values of the sensing information are signal values, one sensor at either side may be included. When the values of the sensing information are differences, two sensors at either side may be included. When the values of the sensing information are dual differences, three sensors at either side may be included.

In step 630, a range of mutual capacitance detection can be one that uses overlapping points on all touch related first sensors or second sensors as the range of mutual capacitance detection, or one that uses overlapping points overlapped by all touch related sensors as the range of mutual capacitance detection. For example, overlapping points overlapped by all touch related first sensors and all touch related second sensors are used as the range of mutual capacitance detection.

Moreover, in step 640, each touch related first sensor can be sequentially provided with a driving signal. When each touch related first sensor is provided with a driving signal, signals of each touch related second sensor or all second sensors are detected to determine the sensing information for at least one range of mutual capacitance detection.

In contrast to the sensing information for at least one range of mutual capacitance detection, in the 2-D sensing information described in step 650, sensing information not corresponding to the at least one range of mutual capacitance detection can be represented by a zero value or a default value. Accordingly, 2-D sensing information encompassing all overlapping points can thus be generated without having to detect the signals of all overlapping points.

In addition, the present invention can also include performing analysis on the partial sensing information or the 2-D sensing information to analyze each touch related sensing information, wherein said analysis at least includes analyzing each touch related sensing information with inner lower values within outer high values, such as touch related sensing information that resembles a valley or basin. Said analysis may also include analyzing each touch related sensing information with inner higher values within outer low values; such as touch related sensing information that resembles a hill.

When the 2-D sensing information is a 2-D differential sensing information, that is, each value of the sensing information corresponding to said at least one range of mutual capacitance detection is generated based on the difference of signals of a pair of sensors, all negative values can be converted to positive values in said analysis, or all positive values to negative values. In a preferred example of the present invention, all negative values can be converted to positive values. Moreover, each value of the sensing information corresponding to said at least one range of mutual, capacitance detection can be generated based on the signals of three sensors, such as a 2-D dual-differential sensing information.

In the present invention, the 2-D sensing information can be signal values, differences or dual differences, and the sensing information of a range of mutual capacitance detection can be signal values, differences or dual differences that are different from 2-D sensing information. Similarly, first 1-D sensing information and/or second 1-D sensing information used for each touch detection may also be different from the sensing information of the range of mutual capacitance detection. One with ordinary skill in the art can appreciate the conversions between said 2-D sensing information, the sensing information of the range of mutual capacitance detection, the first 1-D sensing information and/or second 1-D sensing information from the descriptions previously given.

For example, the first 1-D sensing information and/or second 1-D sensing information can consist of a plurality of signal values; the sensing information of the range of mutual capacitance detection can consist of a plurality of differences; parts of the 2-D sensing information that are relevant to mutual capacitance detection can consist of dual differences, while other parts are represented by zero values.

In a best mode of the present invention, the first 1-D sensing information and/or second 1-D sensing information are 1-D differential sensing information, and parts of the 2-D sensing information that are relevant to mutual capacitance detection can consist of dual differences, while other parts are represented by zero values. The first 1-D sensing information and/or second 1-D sensing information can be generated according to the steps shown in FIG. 6B. Since all of the first sensors are driven simultaneously, interference caused by water stains or conductive impurities on the sensing device can be avoided. Based on the same reason, the range of mutual capacitance detection is determined in a condition where interference caused by water stains or conductive impurities on the sensing device is reduced. During mutual capacitance detection, areas interfered by water stains or conductive impurities on the sensing device are also reduced to as small as possible, so their effects are minimized. If mutual capacitance detection is performed simply on all overlapping points, then the interference caused by water stains or conductive impurities on the sensing device will encompass all the areas where water stains and conductive impurities are present.

The first 1-D sensing information and/or second 1-D sensing information can be generated by performing self capacitance detection on the first sensors and the second sensors, respectively. In performing self capacitance detection on the first sensors, a driving signal is simultaneously provided to these first sensors, and in performing self capacitance detection on the second sensors, a driving signal is simultaneously provided to these second sensors. In doing so, interference caused by water stains or conductive impurities on the sensing device can also be reduced. However, compared to the method in FIG. 6B, it consumes more electricity, and requires longer time since detections need to be performed twice. In short, in the methods shown in FIG. 6, the detections of signals of the first sensors and second sensors can be performed simultaneously. Obviously, the detections of signals of the first sensors and second sensors can be done separately, but it takes longer time.

Operations shown in FIGS. 6A and 6B can be carried out by controller 160, relevant details of which have already been described earlier and will not described in details again. In addition, from descriptions about the driving and/or detection of the first sensors, one can appreciate that the same driving and/or detection can be applied to these 2-D sensors.

Figure 7A:
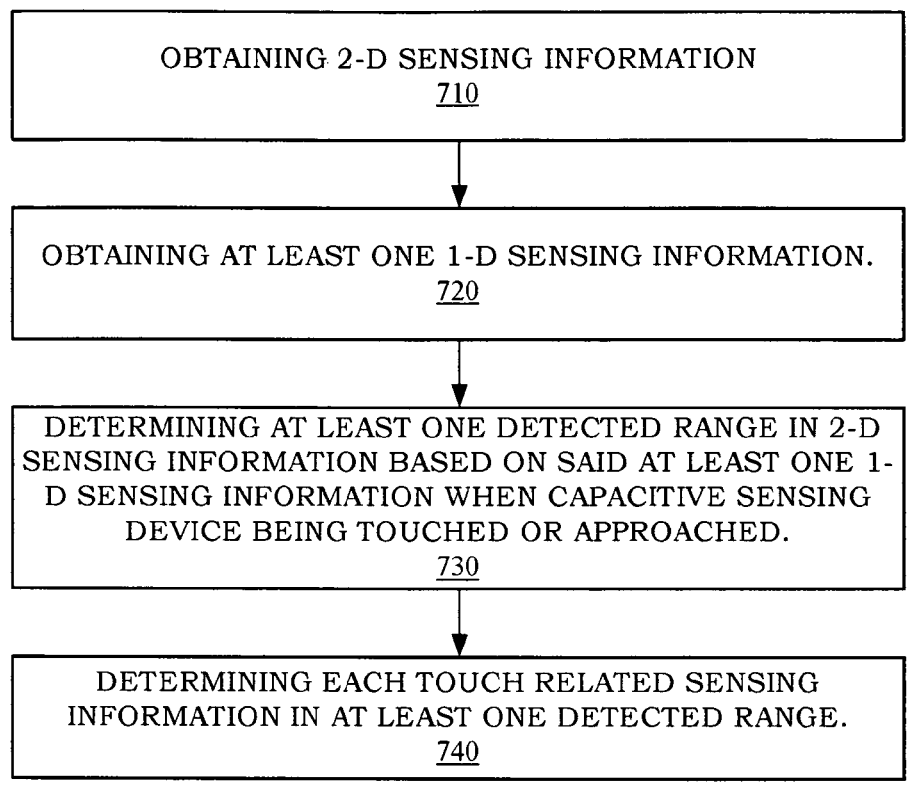
FIGS. 7A and 7B are flowcharts illustrating a method for analyzing 2-D differential sensing information according to a second embodiment of the present invention.

In a second embodiment of the present invention, a method for capacitive position detection is provided and shown in FIG. 7A. First, in step 710, a 2-D sensing information is obtained. Then, in step 720, at least one 1-D sensing information is obtained. Thereafter, in step 730, at least one detected range is determined in the 2-D sensing information based on the at least one 1-D sensing information when a capacitive sensing device is being touched or approached. Next, in step 740, each touch related sensing information is determined in the at least one detected range.

The plurality of 1-D sensing information can be obtained by a capacitive sensing device that includes a plurality of sensors. These sensors include a plurality of first sensors and a plurality of second sensors, wherein these first and second sensors overlapped at a plurality of overlapping points. In addition, steps 710 and 720 can be carried out by controller 160. Furthermore, steps 730 and 740 can be carried out by controller 160 or host 170.

In an example of the present invention, a 2-D sensing information is obtained via mutual capacitance detection, and the 1-D sensing information is deduced based on the 2-D sensing information. For example, a second 2-D sensing information is generated based on the sum of all values of each first 1-D sensing information, that is, each value of the second 2-D sensing information is generated based on the sum of all values of one of these first sensing information. As another example, each value of each first 1-D sensing information is generated based on one, two or three of these sensors, so each value corresponds to a 1-D position, and each value of the deduced 1-D sensing information is generated based on the sum or difference of all the values in the 2-D sensing information corresponding to the same 1-D position. In other words, 1-D sensing information corresponding to these first sensors and/or second sensors can be obtained by simply just performing the mutual capacitance detection, thereby determining touch related sensing information in the 1-D sensing information, or further determining touch related sensors.

In another example of the present invention, 1-D sensing information of these first sensors and/or second sensors can be obtained via self capacitance detection. As shown in steps 610 to 630, all sensors on a first axis are driven by a driving signal, and signals of all the sensors on the first axis are detected to generate 1-D sensing information corresponding to all the sensors on the first axis. Moreover, when all the sensors on the first axis are driven by a driving signal, signals of all sensors on a second axis are detected to generate 1-D sensing information corresponding to all the sensors on second first axis. As another example, 1-D sensing information corresponding to all the sensors on the first axis may be generated by performing self-capacitance detection on all the sensors on the first axis. Similarly, 1-D sensing information corresponding to all the sensors on the second axis may be generated by performing self-capacitance detection on all the sensors on second first axis.

The first and second axes can be one and the other of horizontal and vertical axes, respectively. Sensors on the first axis and sensors on the second axis can be ones and the other of first sensors and second sensors.

Figure 7B:
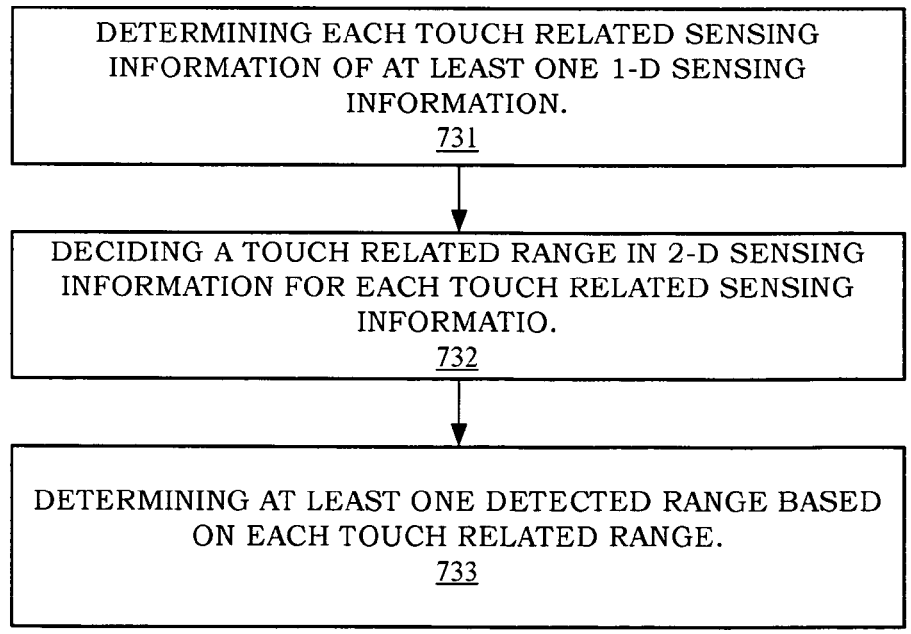

Said determining of at least one detected range is, for example, shown in FIG. 7B. First, in step 731, each touch related sensing information of at least one 1-D sensing information is determined. Next, in step 732, a touch related range in the 2-D sensing information is decided for each touch related sensing information. Then, in step 733, the at least one detected range is determined from each touch related range.

Furthermore, said at least one detected range can be the intersection or union of all the touch related ranges. In other, each value of the at least one 1-D sensing information corresponds to a range on the 2-D sensing information, and each touch related range is a range to which all values of a corresponding touch related sensing information corresponds.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A method for capacitive position detection, comprising:
   providing a capacitive sensing device including a plurality of sensors that include a plurality of first sensors and a plurality of second sensors, wherein these first and second sensors overlap at a plurality of overlapping points;
   detecting each touch related sensor;
   determining at least one range of mutual capacitance detection based on all the touch related sensors;
   performing a mutual capacitance detection on the at least one range of mutual capacitance detection to determine a sensing information of the at least one range of mutual capacitance detection; and
   generating a 2-D sensing information based on the sensing information of the at least one range of mutual capacitance detection.

2. The method of claim 1, wherein said detecting of each touch related sensor includes performing a self capacitance detection on these first sensors to determine each touch related sensor, and the at least one range of mutual capacitance detection includes all the overlapping points on the at least one touch related sensor.

3. The method of claim 2, wherein the self capacitance detection includes simultaneously providing a driving signal to these first sensors, and detecting signals of these first sensors.

4. The method of claim 1, wherein said detecting of each touch related sensor includes performing a self capacitance detection on these sensors to determine each touch related sensor, and the at least one range of mutual capacitance detection includes all the overlapping points on the at least one touch related sensor.

5. The method of claim 1, wherein said detecting of each touch related sensor includes:
   providing a driving signal to these first sensors simultaneously;
   when these first sensors being simultaneously provided with the driving signal, detecting signals of these first sensors to generate a first 1-D sensing information;
   when these first sensors being simultaneously provided with the driving signal, detecting signals of these second sensors to generate a second 1-D sensing information; and
   determining each touch related sensor based on the first 1-D sensing information and the second 1-D sensing information.

6. The method of claim 1, wherein portions in the 2-D sensing information not corresponding to the at least one range of mutual capacitance detection assume the value of zero, so as to generate the 2-D sensing information encompassing these overlapping points.

7. The method of claim 1, further comprising:
   performing an analysis on the sensing information corresponding to the at least one range of mutual capacitance detection or on the 2-D sensing information to analyze each touch related sensing information, wherein the analysis at least includes analyzing each touch related sensing information with inner lower values within outer high values.

8. The method of claim 7, further comprising converting all negative values of the sensing information corresponding to the at least one range of mutual capacitance detection into positive values or all positive values into negative values before the analysis.

9. The method of claim 8, wherein each value of the sensing information corresponding to the at least one range of mutual capacitance detection is generated based on the difference of signals of a pair of sensors.

10. The method of claim 1, wherein each value of the sensing information corresponding to the at least one range of mutual capacitance detection is generated based on signals of three sensors.

11. A device for capacitive position detection, comprising:
    a capacitive sensing device including a plurality of sensors that include a plurality of first sensors and a plurality of second sensors, wherein these first and second sensors overlap at a plurality of overlapping points; and
    a controller for performing operations, comprising:
       detecting each touch related sensor;
       determining at least one range of mutual capacitance detection based on all the touch related sensors;
       performing a mutual capacitance detection on the at least one range of mutual capacitance detection to determine a sensing information of the at least one range of mutual capacitance detection; and
       generating a 2-D sensing information based on the sensing information of the at least one range of mutual capacitance detection.

12. The device of claim 11, wherein said detecting of each touch related sensor includes performing a self capacitance detection on these first sensors to determine each touch related sensor, and the at least one range of mutual capacitance detection includes all the overlapping points on the at least one touch related sensor.

13. The device of claim 12, wherein the self capacitance detection includes simultaneously providing a driving signal to these first sensors, and detecting signals of these first sensors.

14. The device of claim 11, wherein said detecting of each touch related sensor includes performing a self capacitance detection on these sensors to determine each touch related sensor, and the at least one range of mutual capacitance detection includes all the overlapping points on the at least one touch related sensor.

15. The device of claim 11, wherein said detecting of each touch related sensor includes:
    providing a driving signal to these first sensors simultaneously;
    when these first sensors being simultaneously provided with the driving signal, detecting signals of these first sensors to generate a first 1-D sensing information;
    when these first sensors being simultaneously provided with the driving signal, detecting signals of these second sensors to generate a second 1-D sensing information; and determining each touch related sensor based on the first 1-D sensing information and the second 1-D sensing information.

16. The device of claim 11, wherein portions in the 2-D sensing information not corresponding to the at least one range of mutual capacitance detection assume the value of zero, so as to generate the 2-D sensing information encompassing these overlapping points.

17. The device of claim 11, wherein the controller further performs operations, comprising:
   performing an analysis on the sensing information corresponding to the at least one range of mutual capacitance detection or on the 2-D sensing information to analyze each touch related sensing information, wherein the analysis at least includes analyzing each touch related sensing information with inner lower values within outer high values.

18. The device of claim 17, wherein the controller further performs operations, comprising converting all negative values of the sensing information corresponding to the at least one range of mutual capacitance detection into positive values or all positive values into negative values before the analysis.

19. The device of claim 18, wherein each value of the sensing information corresponding to the at least one range of mutual capacitance detection is generated based on the difference of signals of a pair of sensors.

20. The device of claim 11, wherein each value of the sensing information corresponding to the at least one range of mutual capacitance detection is generated based on signals of three sensors.

21. The device of claim 20, the three sensors are adjacent or non-adjacent.

* * * * *